(12) United States Patent
Kubota et al.

(10) Patent No.: US 8,692,259 B2
(45) Date of Patent: Apr. 8, 2014

(54) LIGHT-EMITTING DEVICE AND ELECTRONIC APPARATUS

(75) Inventors: Takehiko Kubota, Suwa (JP); Eiji Kanda, Suwa (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/444,230

(22) Filed: Apr. 11, 2012

(65) Prior Publication Data

US 2012/0199871 A1 Aug. 9, 2012

Related U.S. Application Data

(63) Continuation of application No. 12/959,916, filed on Dec. 3, 2010, now Pat. No. 8,198,636, which is a continuation of application No. 11/624,844, filed on Jan. 19, 2007, now Pat. No. 7,872,264.

(30) Foreign Application Priority Data

Jan. 24, 2006 (JP) .................................. 2006-015370
Oct. 25, 2006 (JP) .................................. 2006-289587

(51) Int. Cl.
*H01L 27/14* (2006.01)
(52) U.S. Cl.
USPC .................. 257/72; 257/40; 257/59; 257/88; 257/E27.113; 257/E27.131
(58) Field of Classification Search
USPC ......................................... 257/40, 59, 72, 88
See application file for complete search history.

(56) References Cited

U.S. PATENT DOCUMENTS

| | | | |
|---|---|---|---|
| 6,456,013 B1 * | 9/2002 | Komiya et al. ............ 315/169.1 |
| 6,847,363 B1 * | 1/2005 | Sauvageau ................... 345/443 |
| 7,250,720 B2 | 7/2007 | Sakakura et al. | |
| 7,580,014 B2 | 8/2009 | Tanaka et al. | |
| 7,956,533 B2 | 6/2011 | Kim et al. | |
| 8,018,403 B2 | 9/2011 | Sakakura et al. | |
| 2002/0132383 A1 | 9/2002 | Hiroki et al. | |
| 2003/0076046 A1 | 4/2003 | Komiya et al. | |
| 2003/0219530 A1 | 11/2003 | Yamazaki et al. | |
| 2004/0032202 A1 | 2/2004 | Fukunaga | |
| 2004/0100202 A1 | 5/2004 | Koyama | |

(Continued)

FOREIGN PATENT DOCUMENTS

| | | |
|---|---|---|
| CN | A-1578571 | 2/2005 |
| JP | A-59-058467 | 4/1984 |

(Continued)

OTHER PUBLICATIONS

Japanese Patent Office, Notification of Reasons for Refusal mailed Dec. 20, 2011 in Japanese Patent Application No. 2006-289587 w/English-language Translation.

*Primary Examiner* — A. Sefer
(74) *Attorney, Agent, or Firm* — Oliff PLC

(57) ABSTRACT

A light-emitting device includes a power feeding line to which a predetermined voltage is supplied; a light-emitting element formed of a first electrode, a second electrode, and a light-emitting layer interposed between the first electrode and the second electrode; and a driving transistor that controls the amount of current supplied to the light-emitting element from the power feeding line. The power feeding line includes a portion interposed between the first electrode and the driving transistor.

11 Claims, 25 Drawing Sheets

(56) References Cited

U.S. PATENT DOCUMENTS

| | | |
|---|---|---|
| 2004/0115989 A1 | 6/2004 | Matsueda et al. |
| 2004/0211964 A1 | 10/2004 | Sakakura et al. |
| 2004/0263441 A1 | 12/2004 | Tanaka et al. |
| 2004/0263444 A1 | 12/2004 | Kimura |
| 2005/0051776 A1 | 3/2005 | Miyagi et al. |
| 2006/0066219 A1 | 3/2006 | Shimoda et al. |
| 2006/0098521 A1 | 5/2006 | Shimoda et al. |
| 2006/0138942 A1 | 6/2006 | Bang et al. |
| 2006/0170634 A1* | 8/2006 | Kwak et al. ............ 345/92 |
| 2006/0202934 A1* | 9/2006 | Shin et al. ............. 345/95 |
| 2007/0108440 A1 | 5/2007 | Kubota |
| 2009/0051674 A1 | 2/2009 | Kimura et al. |
| 2011/0212663 A1 | 9/2011 | Kim et al. |
| 2011/0298362 A1 | 12/2011 | Sakakura et al. |

FOREIGN PATENT DOCUMENTS

| | | |
|---|---|---|
| JP | A-2002-341790 | 11/2002 |
| JP | A-2003-108036 | 4/2003 |
| JP | A-2003-108068 | 4/2003 |
| JP | A-2003-255858 | 9/2003 |
| JP | A-2004-119219 | 4/2004 |
| JP | A-2004-126439 | 4/2004 |
| JP | A-2004-139970 | 5/2004 |
| JP | A-2004-341513 | 12/2004 |
| JP | A-2005-062400 | 3/2005 |
| JP | A-2005-157298 | 6/2005 |
| JP | A-2005-189304 | 7/2005 |
| JP | A-2005-203329 | 7/2005 |
| WO | WO 2006/059737 A1 | 6/2006 |

* cited by examiner

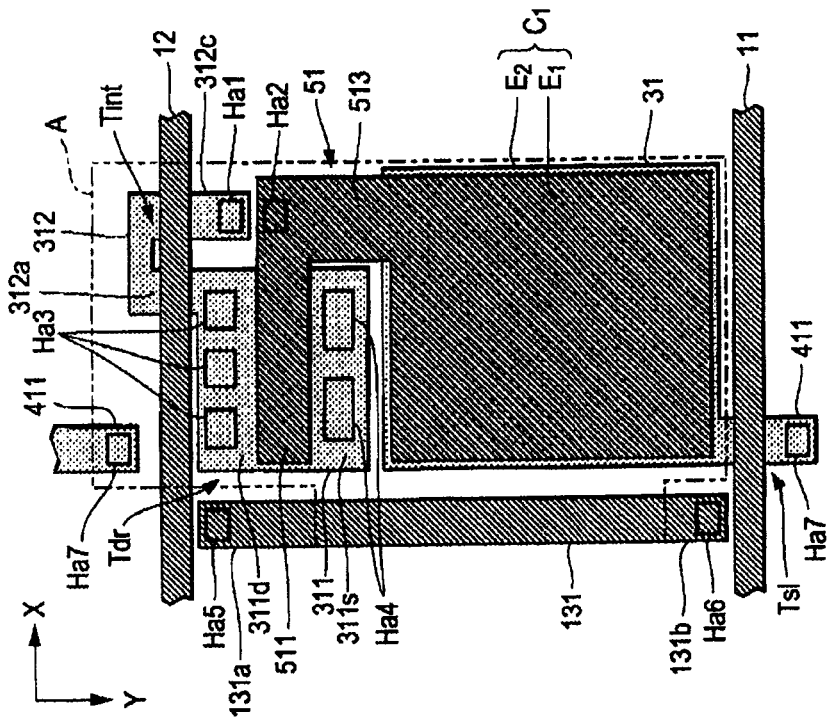
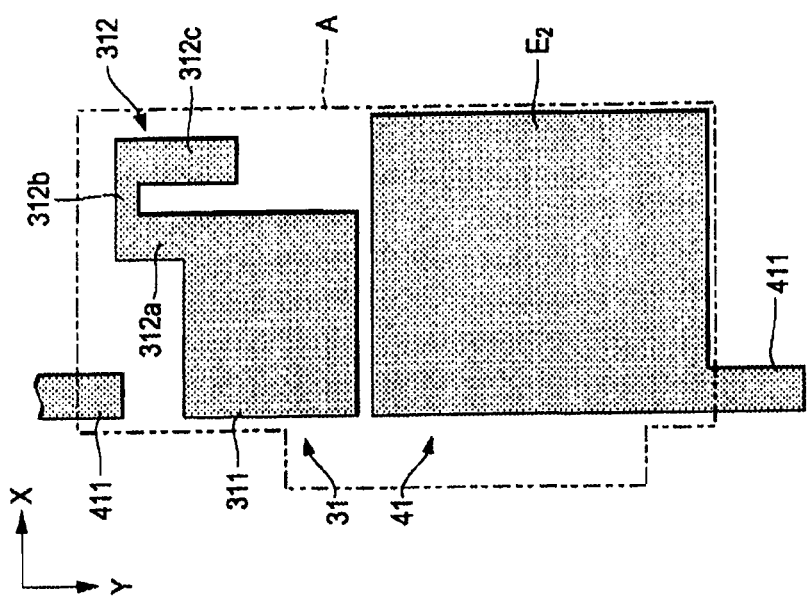

LIGHT-EMITTING DEVICE AND ELECTRONIC APPARATUS

This is a Continuation of application Ser. No. 12/959,916 filed Dec. 3, 2010, which is a Continuation of application Ser. No. 11/624,844 filed Jan. 19, 2007 and claims priority to Japanese Patent Applications Nos. 2006-015370, filed Jan. 24, 2006 and 2006-289587, filed Oct. 25, 2006. The entire disclosures of the prior applications are hereby incorporated herein by reference in their entirety.

BACKGROUND

1. Technical Field

The invention relates to configurations of light-emitting devices in which light-emitting materials, such as electroluminescent (EL) materials, are used.

2. Related Art

Active-matrix light-emitting devices, in which a transistor is provided in association with each light-emitting element to control the amount of current supplied to the light-emitting element, have been proposed (e.g., JP-A-2004-119219). In this type of light-emitting device, for example, in order to improve the numerical aperture (the ratio of regions where light is actually emitted from light-emitting elements to the region where the light-emitting elements are arrayed), layers of transistors and light-emitting elements, and lines for electrically interconnecting these elements are laminated on a substrate.

In the configuration where the elements are laminated as described above, however, capacitive coupling occurs between elements that are located in proximity to each other. That is, stray capacitances could arise between such elements. For example, when the waveforms of various signals are rounded due to stray capacitors of various elements, accurate control of light-emitting elements could be inhibited.

SUMMARY

An advantage of some aspects of the invention is that the effects of stray capacitances associated with various elements of a light-emitting device can be reduced.

According to a first aspect of the invention, there is provided a light-emitting device including a light-emitting element formed of a first electrode, a second electrode, and a light-emitting layer interposed between the first electrode and the second electrode; a driving transistor that controls the amount of current supplied to the light-emitting element; and a capacitor (e.g., a capacitor C1 shown in FIG. 2 or a capacitor C2 shown in FIG. 21 or FIG. 32) electrically connected to a gate electrode of the driving transistor. The first electrode overlaps the capacitor.

In the light-emitting device described above, since the first electrode is formed so as to overlap the capacitor, it is readily possible to allocate an area for the first electrode without forming the first electrode so as to overlap various switching elements used to control the light-emitting element. Therefore, it is possible to reduce a stray capacitance between the first electrode and the switching elements, and therefore to prevent delay in switching operations attributable to the stray capacitance, while allocating a sufficient area for the first electrode.

For example, a selecting transistor (e.g., a selecting transistor Ts1 shown in FIG. 2 or FIG. 21) that is turned on or off according to a selection signal is provided, and a gate electrode of the driving transistor is pulled to a potential corresponding to a data signal supplied through a data line via the selecting transistor when the selecting transistor is turned on. In this case, the first electrode is formed so as not to overlap the selecting transistor. According to this configuration, the stray capacitance between the first electrode and the selecting transistor is reduced. Accordingly, high-speed operation of the selecting transistor is allowed (i.e., delay attributable to the stray capacitance can be prevented).

As another example, an initializing transistor (e.g., an initializing transistor Tint shown in FIG. 2) that is turned on or off according to an initialization signal is provided, and a gate electrode and a drain electrode of the driving transistor are electrically connected to each other via the initializing transistor when the initializing transistor is turned on. In this case, the first electrode is formed so as not to overlap the initializing transistor. According to this configuration, the stray capacitance between the first electrode and the initializing transistor is reduced. Accordingly, high-speed operation of the initializing transistor is allowed. The gate electrode of the driving transistor electrically connected via the initializing transistor is pulled to a potential corresponding to a threshold voltage of the driving transistor. Thus, it is possible to compensate for an error of the threshold voltage of the driving transistor.

The capacitor is typically used to set or maintain a gate voltage of the driving transistor. In an example configuration, the capacitor (e.g., the capacitor C1 shown in FIG. 2) is located between the gate electrode of the driving transistor and the data line. In this configuration, the gate electrode of the driving transistor is pulled to a potential corresponding to an amount of change in the potential of the data line. In another example configuration, the capacitor (e.g., the capacitor C2 shown in FIG. 21 or FIG. 32) is located between the gate electrode of the driving transistor and a line (e.g., a power supply line) through which a constant voltage is supplied. In this configuration, a voltage supplied from the data line to the gate electrode of the driving transistor is maintained by the capacitor.

According to a second aspect of the invention, there is provided a light-emitting device including a power feeding line (e.g., a power supply line 15 shown in FIG. 2 or FIG. 21) through which a predetermined voltage is supplied; a light-emitting element formed of a first electrode, a second electrode, and a light-emitting layer interposed between the first electrode and the second electrode; and a driving transistor that controls the amount of current supplied to the light-emitting element through the power feeding line. The power feeding line is typically a power supply line for supplying a power supply voltage.

In this configuration, the power feeding line exists between the first electrode and the driving transistor. Therefore, compared with a configuration where a conductor does not exist between the first electrode and the driving transistor, capacitive coupling between these elements is suppressed. Accordingly, the effect of change in the potential of one of the first electrode and the driving transistor on the potential of other can be alleviated.

According to a third aspect of the invention, there is provided a light-emitting device including a data line through which a data signal is supplied, a power feeding line through which a predetermined voltage is supplied; a light-emitting element formed of a first electrode, a second electrode, and a light-emitting layer interposed between the first electrode and the second electrode; and a driving transistor that controls the amount of current supplied to the light-emitting element through the power feeding line according to the data signal. The power feeding line includes a portion interposed between the first electrode and the driving transistor. In this configuration, the power feeding line exists between the first electrode and the data line. Therefore, compared with a configuration where a conductor does not exist between the first electrode and the data line, capacitive coupling between these elements is suppressed. Accordingly, the effect of change in the potential of one of the first electrode and the data line on the potential of other can be alleviated.

According to a fourth aspect of the invention, there is provided a light-emitting device including a data line through which a data signal is supplied, a light-emitting element formed of a first electrode, a second electrode, and a light-emitting layer interposed between the first electrode and the second electrode; and a driving transistor that controls the amount of current supplied to the light-emitting element according to the data signal. The first electrode is a light-reflecting electrode formed on a surface of an insulating layer (e.g., a first insulating layer L1 or a second insulating layer L2 shown in FIG. 11) covering the data line, and a periphery thereof overlaps the data line.

In this configuration, by making variation in height on the surface of the insulating layer so as to reflect the thickness of the data line, it is possible to form an inclined surface (e.g., an inclined surface 211 shown in FIG. 11) in the proximity of the periphery of the first electrode. The efficiency of usage of light can be improved by causing light emitted from the light-emitting layer to be reflected on the inclined surface.

According to a fifth aspect of the invention, there is provided a light-emitting device including a light-emitting element formed of a first electrode, a second electrode, and a light-emitting layer interposed between the first electrode and the second electrode; a driving transistor that controls the amount of current supplied to the light-emitting element; a capacitor electrically connected to a gate electrode of the driving transistor; and an auxiliary line electrically connected to the second electrode, the auxiliary line being formed of a material having a resistivity lower than a resistivity of a material of the second electrode. The auxiliary line does not overlap the driving transistor or the capacitor.

In this configuration, since the auxiliary line is formed so as not to overlap the driving transistor or the capacitor, the stray capacitance between the auxiliary line and the driving transistor or between the auxiliary line and the capacitor is reduced. Therefore, the effect of change in the potential of one of the auxiliary line and the driving transistor (or the capacitor) on the potential of the other can be alleviated.

In the light-emitting device according to the fifth aspect, for example, a selecting transistor that is turned on or off according to a selection signal, and an insulating layer (e.g., a wall 25 shown in FIG. 4) overlapping the selecting transistor and having an aperture (e.g., an aperture 251 shown in FIG. 4) are provided. In this case, the driving transistor controls the amount of current supplied to the light-emitting element according to a data signal supplied through a data line via the selecting transistor when the selecting transistor is turned on. In this configuration, the auxiliary line can be formed suitably above the insulating layer. In this configuration, the insulating layer exists between the auxiliary line and the selecting transistor. Thus, capacitive coupling between the auxiliary line and the selecting transistor is suppressed. In order to allocate sufficient areas for a power supply line and an aperture through which the light-emitting element emits light, preferably, the selecting transistor is formed so as to overlap the auxiliary line.

In another example, an initializing transistor that is turned on or off according to an initialization signal, an insulating layer overlapping the initializing transistor and having an aperture are provided. Also in this configuration, the auxiliary line can be formed suitably above the insulating layer.

According to this configuration, capacitive coupling between the auxiliary line and the initializing transistor is suppressed. In order to allocate sufficient areas for a power supply line and an aperture through which the light-emitting element emits light, preferably, the initializing transistor is formed so as to overlap the auxiliary line.

According to a sixth aspect of the invention, there is provided a light-emitting device including a plurality of control lines extending in a first direction (e.g., an X direction in FIGS. 18 to 20 or FIGS. 28 to 30); a data line extending in a second direction (e.g., a Y direction in FIGS. 18 to 20 or FIGS. 28 to 30) and crossing the plurality of control lines, the second direction being different from the first direction; and a plurality of unit elements arrayed in the second direction and located at positions corresponding to intersections between the plurality of control lines and the data line. Each of the plurality of unit elements includes a light-emitting element formed of a first electrode, a second electrode, and a light-emitting layer interposed between the first electrode and the second electrode; a driving transistor that controls the amount of current supplied to the light-emitting element according to a potential of a gate electrode of the driving transistor, the potential of the gate electrode being set according to a signal supplied through the data line; and a control transistor that controls whether or not a predetermined voltage is to be supplied to the gate electrode of the driving transistor or whether or not a current is to be supplied to the light-emitting element, according to a signal supplied through a control line associated with the unit element among the plurality of control lines. The control transistor that controls whether or not to supply a predetermined voltage to the gate electrode of the driving transistor corresponds to, for example, a selecting transistor Ts1 or an initializing transistor Tint shown in FIG. 2. The control transistor that controls whether or not to supply a current to the light-emitting element corresponds to, for example, a light-emission controlling transistor Tcnt shown in FIG. 31. Thus, the control line in this aspect corresponds to, for example, a selecting line 11 or an initializing line 12 shown in FIG. 2 or a light-emission controlling line 14 shown in FIG. 31.

In this configuration, in a first unit element (e.g., a unit element P on an i-th row in FIGS. 18 to 20 or FIGS. 28 to 30) among the plurality of unit elements, the control transistor and the control line are located on a first side of the driving transistor in the second direction. On the other hand, in a second unit element (e.g., a unit element P on an (i−1)-th row) and a third unit element (e.g., a unit element P on an (i+1)-th row) among the plurality of unit elements, the second unit element being adjacent to the first unit element on the first side in the second direction and the third unit element being adjacent to the first unit element on a second side in the second direction, the control transistor and the control line are located on the second side of the driving transistor in the second direction. The data line includes a plurality of first data-line portions and a second data-line portions, the plurality of first data-line portions being formed out of the same layer as the plurality of control lines and arrayed in the second direction, and the second data-line portion being formed on a surface of an insulating layer covering the plurality of control lines and electrically interconnecting the plurality of first data-line portions. The first data-line portions are formed contiguously in association with the first unit element and the third unit element, and the second data-line portion crosses the control line associated with the first unit element and the control line associated with the second unit element.

According to this configuration, since the first data-line portions are formed contiguously in association with the first unit element and the third unit element, the second data-line portion need not be formed in the space between the first unit element and the third unit element. In this specification, when a plurality of elements is formed in the same process by selective removal of a common film (regardless of whether the film is a single-layer film or a multi-layer film), the plurality of elements will be described as "formed out of the same layer", regardless of whether the elements are formed contiguously or separately. Specific examples of the sixth aspect described above will be described later as third and fifth embodiments.

In the light-emitting device according to the sixth aspect, for example, a power feeding line through which a predetermined voltage is supplied is provided, and the driving transistor controls the amount of current supplied to the light-emitting element through the power feeding line. The power feeding line is formed out of the same layer as the second data-line portions of the data line, and the power feeding line includes a portion (e.g., a connecting portion 153 shown in FIG. 29) of the first data-line portion, the portion of the first data-line portion being located in a space between the first unit element and the third unit element. According to this configuration, since the portion located between the first unit element and the third unit element is included, it is possible to reduce the resistance of the power feeding line.

In a more preferable configuration, an auxiliary line electrically connected to the second electrode, formed of a material having a resistivity lower than a resistivity of a material of the second electrode, is provided. The auxiliary line is formed so as to overlap the control transistor and the control line of the first unit element and the control transistor and the control line of the second unit element, and is not formed in a space between the first unit element and the third unit element. According to this configuration, compared with a configuration where auxiliary lines are formed in association with individual unit elements, the width of the auxiliary line formed between the first unit element and the second unit element can be increased. In this configuration, high precision is not required in the formation of the auxiliary line. Therefore, the auxiliary line can be formed by low-cost techniques. Furthermore, since the number of auxiliary line formed in the light-emitting device is small, margin areas provided between individual auxiliary lines and other elements can be reduced. Accordingly, it is possible to allocate larger areas for the auxiliary lines or light-emitting regions of light-emitting elements.

The light-emitting devices according to these aspects of the invention can be used in various electronic apparatuses. A typical example of such an electronic apparatus is an apparatus including one of the light-emitting devices as a display, such as a personal computer or a cellular phone. However, applications of the light-emitting devices are not limited to image display. For example, the light-emitting devices can be used in an exposure apparatus (exposure head) for forming a latent image on an image carrier, such as a photosensitive drum, by radiation of light, an apparatus provided at the back of a liquid crystal apparatus to emit light (backlight), or various illuminating apparatuses, such as an apparatus mounted in an image reader such as a scanner to cast light on a document.

BRIEF DESCRIPTION OF THE DRAWINGS

The invention will be described with reference to the accompanying drawings, wherein like numbers reference like elements.

FIG. 5 is a plan view showing a phase where a gate insulating layer has been formed.

FIG. 6 is a plan view showing a phase where a first insulating layer has been formed.

DESCRIPTION OF EXEMPLARY EMBODIMENTS

A: First Embodiment

A-1: Electrical Configuration of Light-Emitting Device

Figure 1:
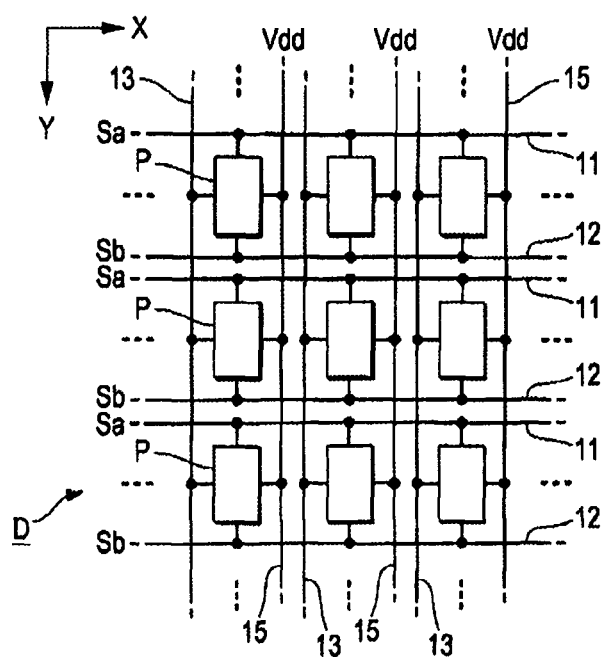
FIG. 1 is a block diagram showing an array of a plurality of unit elements in a light-emitting device according to a first embodiment.

FIG. 1 is a block diagram showing the electrical configuration of a light-emitting device D according to a first embodiment of the invention. As shown in FIG. 1, the light-emitting device D includes a plurality of selecting lines 11, a plurality of initializing lines 12, and a plurality of data lines 13. Each of the selecting lines 11 and each of the initializing lines 12 extends in an X direction. Each of the data lines 13 extends in a Y direction, which is perpendicular to the X direction. At each intersection of a pair of a selecting line 11 and an initializing line 12 with a data line 13, a unit element (pixel) P is provided. Thus, unit elements P are arrayed in the X and Y directions to form a matrix. Each unit element P is a minimum unit for light emission. Each unit element P receives a high-side power supply voltage Vdd via a power supply line 15.

Figure 2:
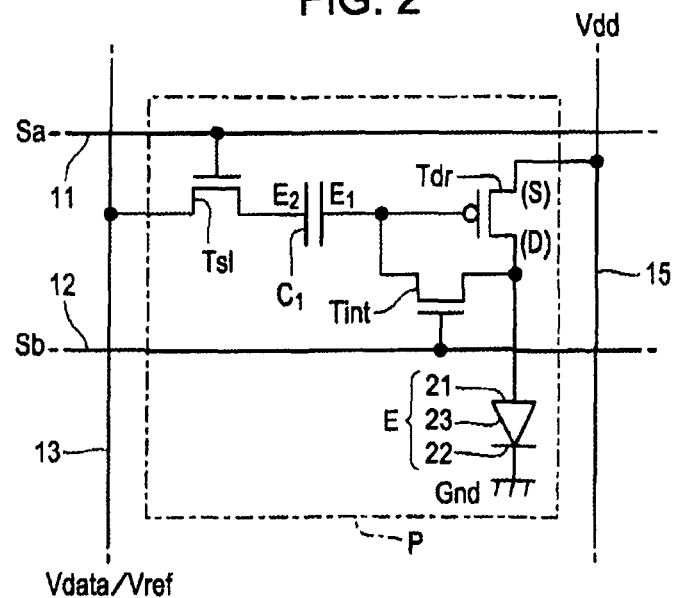
FIG. 2 is a circuit diagram showing an electrical configuration of each unit element.

FIG. 2 is a circuit diagram showing the configuration of each unit element P. As shown in FIG. 2, on a path extending from the power supply line 15 to a ground line (which is at a ground potential Gnd), a light-emitting element E and a driving transistor Tdr are provided. The light-emitting element E is formed of a first electrode 21 (anode), a second electrode 22 (cathode), and a light-emitting layer 23 interposed between the first electrode 21 and the second electrode 22. The light-emitting layer 23 is composed at least of an organic EL material. The first electrodes 21 of individual unit elements P are formed separately from each other. On the other hand, the second electrodes 22 are formed contiguously in association with a plurality of unit elements P and are connected to ground (Gnd). The light-emitting layer 23 emits an amount of light corresponding to an amount of current that flows from the first electrode 21 to the second electrode 22.

The driving transistor Tdr is a p-channel thin-film transistor for controlling the amount of current supplied to the light-emitting element E according to a potential Vg at a gate electrode of the driving transistor Tdr (hereinafter referred to as a "gate potential"). The driving transistor Tdr has a source electrode (S) connected to the power supply line 15, and a drain electrode (D) connected to the first electrode 21 of the light-emitting element E.

Between the gate electrode and the drain electrode (the first electrode 21 of the light-emitting element E) of the driving transistor Tdr, an n-channel transistor Tint for controlling the electrical connection between these electrodes (hereinafter referred to as an "initializing transistor") is provided. The initializing transistor Tint has a gate electrode connected to the initializing line 12. The initializing line 12 receives an initializing signal Sb from a driving circuit (not shown). When the initializing signal Sb is pulled to an active level so that the initializing transistor Tint is turned on, the gate electrode and the drain electrode of the driving transistor Tdr are electrically connected to each other (a diode connection is formed). In the following description, a term "diode connection" is sometimes used to describe the state of the driving transistor Tdr where the gate electrode and the drain electrode of the driving transistor Tdr are electrically connected to each other via the initializing transistor Tint that has been turned on.

As shown in FIG. 2, the unit element P includes a capacitor C1 formed of an electrode E1 and an electrode E2. The electrode E1 is connected to the gate electrode of the driving transistor Tdr. Between the electrode E2 and the data line 13, an n-channel transistor Ts1 for controlling the electrical connection between the electrode E2 and the data line 13 (hereinafter referred to as a "selecting transistor") is provided. The selecting transistor Ts1 has a gate electrode connected to the selecting line 11. The selecting line 11 receives a selecting signal Sa from a driving circuit (not shown). The conductivity types of the driving transistor Tdr, the selecting transistor Ts1, and the initializing transistor Tint may be changed as appropriate from those in the example shown in FIG. 2.

Next, the operation of a single unit element P will be described regarding an initializing period, a writing period, and a driving period. First, in the initializing period, a predetermined voltage Vref is supplied from a driving circuit (not shown) to the data line 13, and the selecting signal Sa on the selecting line 11 and the initializing signal Sb on the initializing line 12 are maintained at an active level (high level). Thus, the voltage Vref is supplied from the data line 13 to the electrode E2 of the capacitor C1 via the selecting transistor Ts1. Furthermore, the initializing transistor Tint is turned on, whereby a diode connection is formed in the driving transistor Tdr. Thus, the gate potential Vg of the driving transistor Tdr converges to a difference between the power supply voltage Vdd supplied to the power supply line 15 and a threshold voltage Vth of the driving transistor Tdr (Vg=Vdd−Vth).

When the initializing period has been finished, in the writing period, the initializing signal Sb changes to a non-active level (low level). Thus, the initializing transistor Tint is turned off, whereby the diode connection of the driving transistor Tdr is deactivated. Furthermore, with the selecting transistor Ts1 kept turned on, the voltage supplied from the data line 13 to the electrode E2 changes from the voltage Vref to a data voltage Vdata. The data voltage Vdata is a voltage corresponding to a tone specified for the unit element P.

Since the impedance at the gate electrode of the driving transistor Tdr is sufficiently high, when the potential at the electrode E2 changes from the voltage Vref to the data voltage Vdata by an amount of change $\Delta V$ (=Vref−Vdata), by capacitive coupling in the capacitor C1, the potential at the electrode E1 changes from the potential Vg (=Vdd−Vth) set in the initializing period. The amount of change in the potential at the electrode E1 at this time is determined in accordance with the capacitance ratio between the capacitor C1 and stray capacitors (e.g., a gate capacitance of the driving transistor Tdr and stray capacitors on other lines). More specifically, the amount of change in the potential at the electrode E1 can be expressed as $\Delta V \cdot C/(C+Cs)$, where C denotes the capacitance of the capacitor C1 and Cs denotes the capacitance of the stray capacitors. Thus, at the end of the writing period, the gate potential Vg of the driving transistor Tdr is set to a level according to equation (1) below:

$$Vg = Vdd - Vth - k \cdot \Delta V \qquad (1)$$

where $k=C/(C+Cs)$.

When the writing period has been finished, in the driving period, the selecting signal Sa changes to a non-active level, whereby the selecting transistor Ts1 is turned off. Then, a current corresponding to the gate potential Vg of the driving transistor Tdr is supplied from the power supply line 15 to the light-emitting element E via the source electrode and the drain electrode of the driving transistor Tdr. In response to the current supplied, the light-emitting element E emits an amount of light corresponding to the data voltage Vdata.

Now, assuming that the driving transistor Tdr operates in a saturated region, the amount of current I supplied to the light-emitting element E in the driving period can be expressed by equation (2) below, where β denotes a gain factor of the driving transistor Tdr, and Vgs denotes a voltage between the gate and source of the driving transistor Tdr:

$$I = (\beta/2)(Vgs - Vth)^2 \quad (2)$$
$$= (\beta/2)(Vdd - Vg - Vth)^2$$

By assigning equation (1), equation (2) can be rewritten as follows:

$$I = (\beta/2)(k \cdot -V)^2$$

As understood from the above equation, the amount of current I supplied to the light-emitting element E does not depend on the threshold voltage Vth of the driving transistor Tdr. Thus, according to this embodiment, errors in the amounts of light emitted by the individual light-emitting elements E (variation in luminance) due to variation in the threshold voltages Vth of the individual driving transistors Tdr (deviation from designed values or differences with the driving transistors Tdr of other unit elements P) can be suppressed.

A-2: Configuration of Unit Element P

Figure 3:
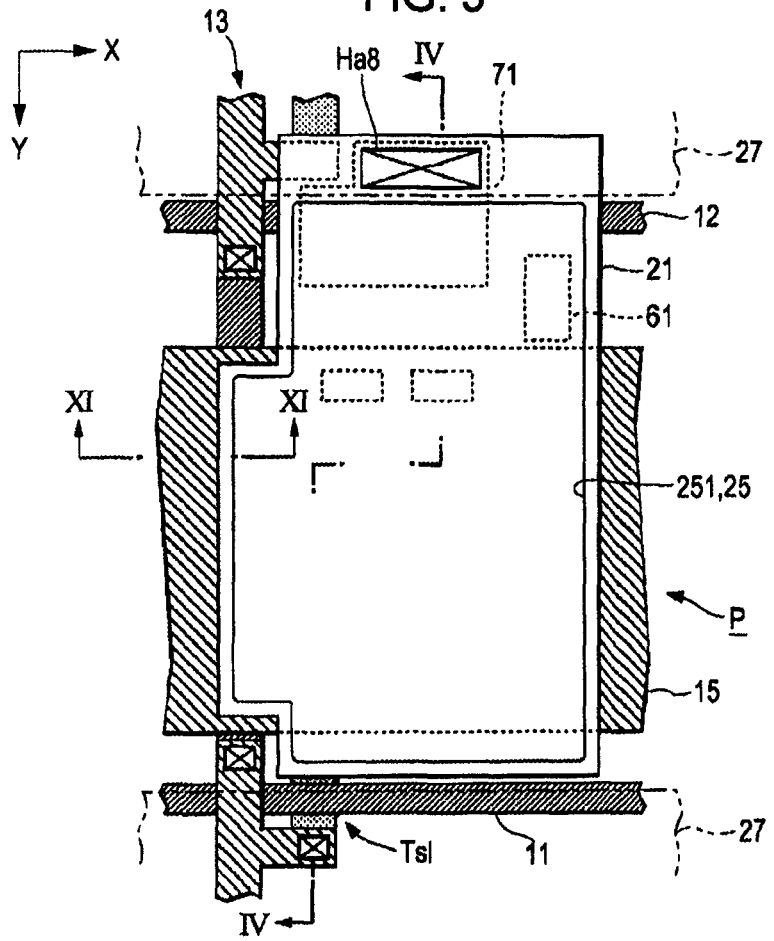
FIG. 3 is a plan view showing a configuration of a unit element in the first embodiment.
Figure 4:
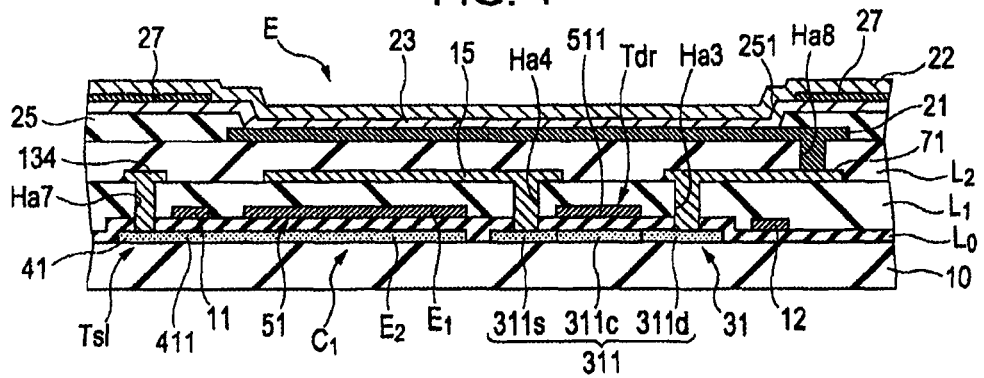
FIG. 4 is a sectional view taken along a line IV-IV in FIG. 3.

Next, a specific configuration of the unit element P will be described. FIG. 3 is a plan view showing the configuration of a unit element P, and FIG. 4 is a sectional view taken along a line IV-IV in FIG. 3. Although FIG. 3 is a plan view, in order to facilitate recognition of individual elements, elements corresponding to those shown in FIG. 4 are hatched as in FIG. 4 as appropriate. This similarly applies to other plan views that are referred to in the following description. Furthermore, in the figures that are referred to in the following description, for the convenience of description, the dimensions and ratios of individual elements are varied as appropriate from those in the actual device.

As shown in FIG. 4, the elements shown in FIG. 2, such as the driving transistor Tdr and the light-emitting element E, are formed on a surface of a substrate 10. The substrate 10 is a plate composed at least of an insulating material, such as glass or plastic. The elements of the unit element P may be formed on the surface of the substrate 10 using an insulating film (e.g., a silicon oxide film or a silicon nitride film) covering the substrate 10 as a base. The light-emitting device D in this embodiment is a top-emission light-emitting device. Thus, the substrate 10 does not require optical transparency.

Figure 7:
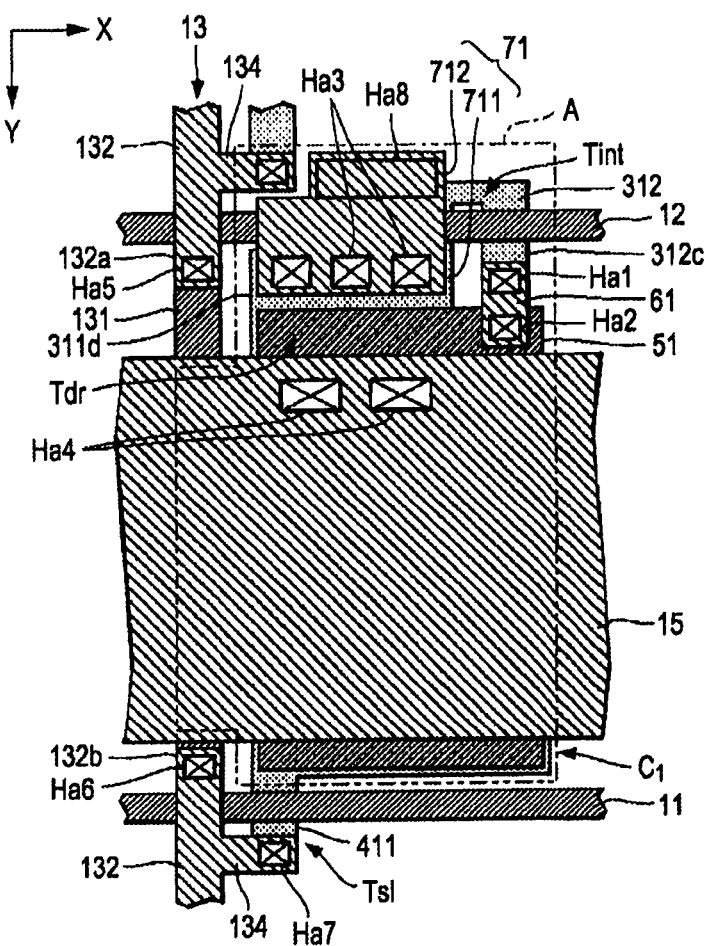
FIG. 7 is a plan view showing a phase where a second insulating layer has been formed.

FIGS. 5 to 7 are plan views showing the states on the surface of the substrate 10 in different phases of formation of the unit element P. In FIGS. 5 to 7, an area A where the first electrode 21 shown in FIG. 3 is to be formed is indicated by a double-dotted line.

As shown in FIGS. 4 and 5, on the surface of the substrate 10, a semiconductor layer 31 and a semiconductor layer 41 are formed of a semiconductor material, such as silicon. The semiconductor layer 31 and the semiconductor layer 41 are formed simultaneously in the same process by patterning a film continuously formed over the entire surface of the substrate 10. Hereinafter, when a plurality of elements is formed commonly in the same process by selective removal of a film (regardless of whether the film is a single-layer film or a multi-layer film), as in the case of the semiconductor layer 31 and the semiconductor layer 41, the plurality of elements is described as "formed out of the same layer". Obviously, the elements formed out of the same layer are composed of the same material, and the elements have substantially the same thicknesses. In a configuration where a plurality of elements is formed out of the same layer, compared with a configuration where the individual elements are formed out of different layers, advantageously, manufacturing processes can be simplified, and manufacturing cost can be reduced.

As shown in FIGS. 4 and 5, the semiconductor layer 31 includes a first element portion 311 and a second element portion 312. The first element portion 311 is a substantially rectangular portion that functions as a semiconductor layer of the driving transistor Tdr. The second element portion 312 is a portion that functions as a semiconductor layer of the initializing transistor Tint. The second element portion 312 includes a portion 312a extending contiguously from the first element portion 311 in the negative Y direction, a portion 312b extending from the portion 312a in the positive X direction, and a portion 312c extending from the portion 312b in the positive Y direction.

The semiconductor layer 41 is a portion located on the positive Y side of the semiconductor layer 31. The semiconductor layer 41 includes the electrode E2 forming the capacitor C1 shown in FIG. 2, which is substantially rectangular, and an element portion 411 from the electrode E2 extending in the positive Y direction. The element portion 411 functions as a semiconductor layer of the selecting transistor Ts1.

As shown in FIG. 4, the entire surface of the substrate 10 with the semiconductor layer 31 and the semiconductor layer 41 formed thereon is covered with a gate insulating layer L0. As shown in FIGS. 4 and 6, on the surface of the gate insulating layer L0, the selecting line 11, the initializing line 12, an intermediate conductor 51, and a first data-line portion 131 are formed of a conductive material out of the same layer.

The selecting line 11 extends in the X direction in association with a plurality of unit elements P, and overlaps the element portion 411 of the semiconductor layer 41. In the element portion 411, a region opposing the selecting line 11 via the gate insulating layer L0 serves as a channel region of the selecting transistor Ts1. The initializing line 12 extends in the X direction in association with a plurality of unit elements P, and overlaps the second element portion 312 of the semiconductor layer 31. In the portions 312a and 312c of the second element portion 312, regions opposing the initializing line 12 via the gate insulating layer L0 serve as channel regions of the initializing transistor Tint. That is, the initializing transistor Tint in this embodiment is a dual-gate transistor.

The intermediate conductor 51 is a portion formed in the space between the selecting line 11 and the initializing line 12, and includes the electrode E1, a gate electrode 511, and a connecting portion 513. The electrode E1 is a substantially rectangular region overlapping the electrode E2 of the semiconductor layer 41 when viewed perpendicularly to the substrate 10. As shown in FIGS. 4 and 6, the capacitor C1 shown in FIG. 2 is formed of the electrodes E1 and E2 opposing each other via the gate insulating layer L0 (dielectric layer).

As shown in FIG. 6, the connecting portion 513 extends in the negative Y direction from an upper right portion of the electrode E1. The gate electrode 511 extends in the negative X direction from the connecting portion 513 with a gap from the electrode E1, and overlaps the first element portion 311 along substantially the entire width (in the X direction) of the first element portion 311. As shown in FIG. 4, in the first element portion 311, a region opposing the gate electrode 511 via the gate insulating layer L0 serves as a channel region 311c of the driving transistor Tdr. Furthermore, in the first element portion 311, a region nearer to the electrode E2 than the channel region 311c (i.e., a region located in the space between the gate electrode 511 and the electrode E1 when viewed perpendicularly to the substrate 10 as in FIG. 6) serves as a source region 311s, and a region located opposite to the source region 311s with respect to the channel region 311c serves as a drain region 311d.

The first data-line portion 131 is a portion constituting the data line 13 shown in FIG. 2. The first data-line portion 131 is located on the negative X side of the intermediate conductor 51, and extends in the Y direction in the space between the selecting line 11 and the initializing line 12.

Figure 8:
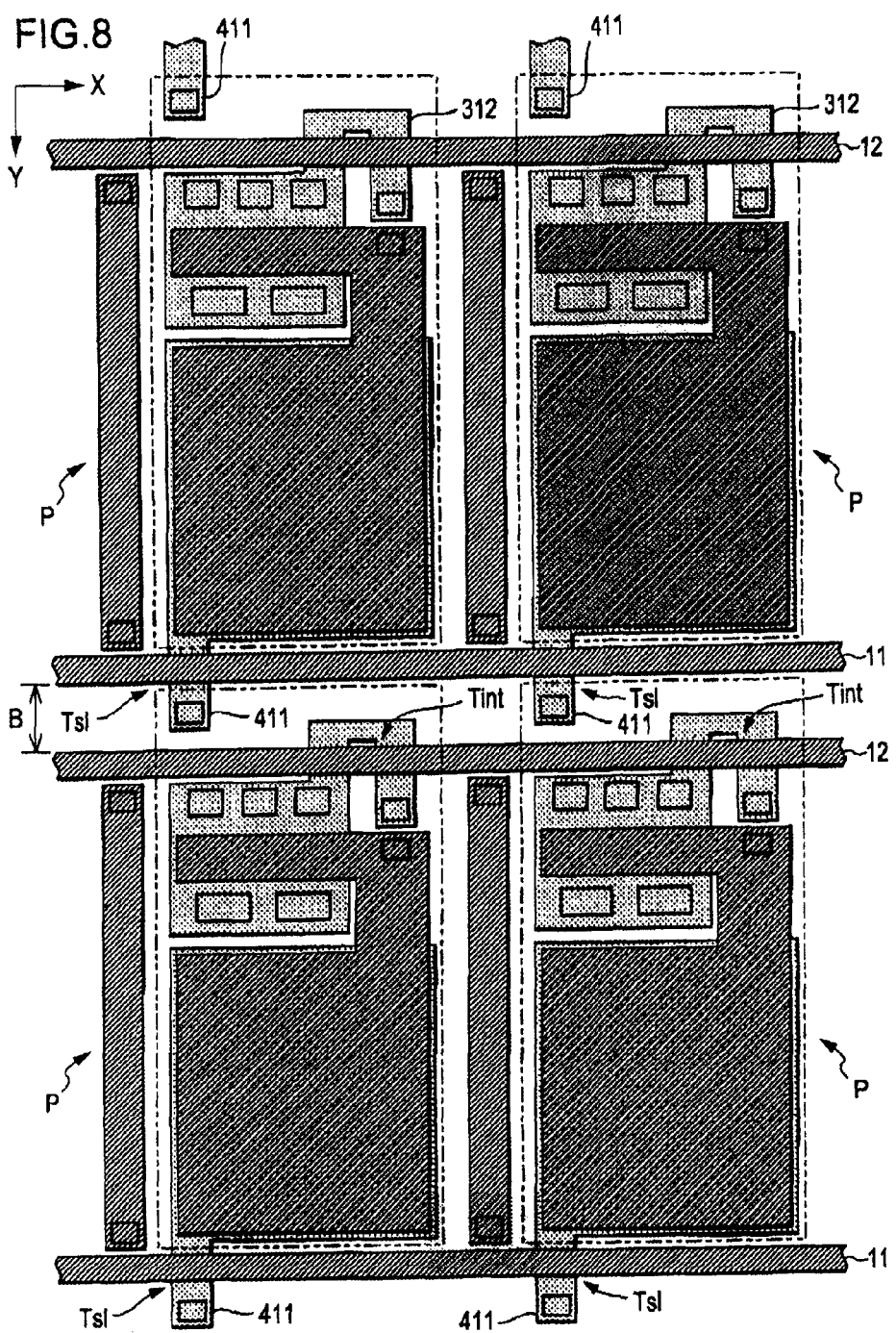
FIG. 8 is a plan view showing a plurality of unit element in a phase where the first insulating layer has been formed.

FIG. 8 is a plan view showing four unit elements P in the phase shown in FIG. 6, arrayed in the X and Y directions. As shown in FIGS. 6 and 8, in each unit element P, the second element portion 312 (the initializing transistor Tint) formed in a peripheral region on the negative Y side is located on the positive X side, and the element portion 411 (the selecting transistor Ts1) formed in a peripheral region on the positive Y side is located on the negative X side.

Now, a configuration in which the second element portion 312 and the element portion 411 are located on the same side in the X direction in each unit element P will be considered. In this configuration, in order to separate the second element portion 312 and the element portion 411 reliably, sufficient spaces (corresponding to a region B in FIG. 8) must be allocated between unit elements P adjacent in the Y direction. This inhibits increasing the density of unit elements P. In contrast, according to this embodiment, the second element portion 312 and the element portion 411 are located on different sides in the X direction in each unit element P. Thus, the second element portions 312 and the element portions 411 are located alternately along the X direction in the region B, as shown in FIG. 8. In this configuration, even when the region B is narrow, the second element portion 312 and the element portion 411 are separated reliably. Thus, advantageously, it is readily possible to increase the density of unit elements P.

As shown in FIG. 4, the entire surface of the gate insulating film L0 with the intermediate conductor 51 and the first data-line portion 131 formed thereon is covered by a first insulating layer L1. As shown in FIGS. 4 and 7, on the surface of the first insulating layer L1, a connecting portion 61, a conducting portion 71, the power supply line 15, and a second data-line portion 132 are formed of a conductive material out of the same layer.

When viewed perpendicularly to the substrate 10 as in FIG. 7, the connecting portion 61 overlaps the portion 312c of the second element portion 312 and the intermediate conductor 51 (the gate electrode 511). The connecting portion 61 is connected to the portion 312c via a contact hole Ha1 penetrating the first insulating layer L1 and the gate insulating layer L0. Furthermore, the connecting portion 61 is connected to the intermediate conductor 51 via a contact hole Ha2 penetrating the first insulating layer L1. That is, the gate electrode 511 of the driving transistor Tdr (the electrode E1 of the capacitor C1) is electrically connected to the channel region of the initializing transistor Tint via the connecting portion 61. In this specification, a "contact hole" refers to a portion electrically interconnecting an element on one side of an insulating layer to an element on the other side of the insulating layer. More specifically, a contact hole is a portion penetrating an insulating layer in a thickness direction of the insulating layer. The planar shape of the contact hole may be any shape.

The conducting portion 71 is a portion interposed between the driving transistor Tdr and the light-emitting element E and electrically interconnecting the driving transistor Tdr and the light-emitting element E. When viewed perpendicularly to the substrate 10, the conducting portion 71 is located opposite to the capacitor C1 with respect to the driving transistor Tdr (i.e., on the negative Y side of the driving transistor Tdr). In this embodiment, the conducting portion 71 has a portion 711 overlapping the drain region 311d of the first element portion 311 and a portion 712 located opposite to the portion 711 with respect to the initializing line 12. The portion 711 and the portion 712 are formed contiguously with each other.

Of the first insulating layer L1, in a region overlapping the drain region 311d when viewed perpendicularly to the substrate 10, a plurality of contact holes Ha3 penetrating the first insulating layer L1 and the gate insulating layer L0 is formed. The contact holes Ha3 are arrayed in the X direction, in which the gate electrode 511 extends (i.e., in the direction of the channel width of the driving transistor Tdr). The portion 711 of the conducting portion 71 is connected to the drain region 311d via the contact holes Ha3.

Figure 9:
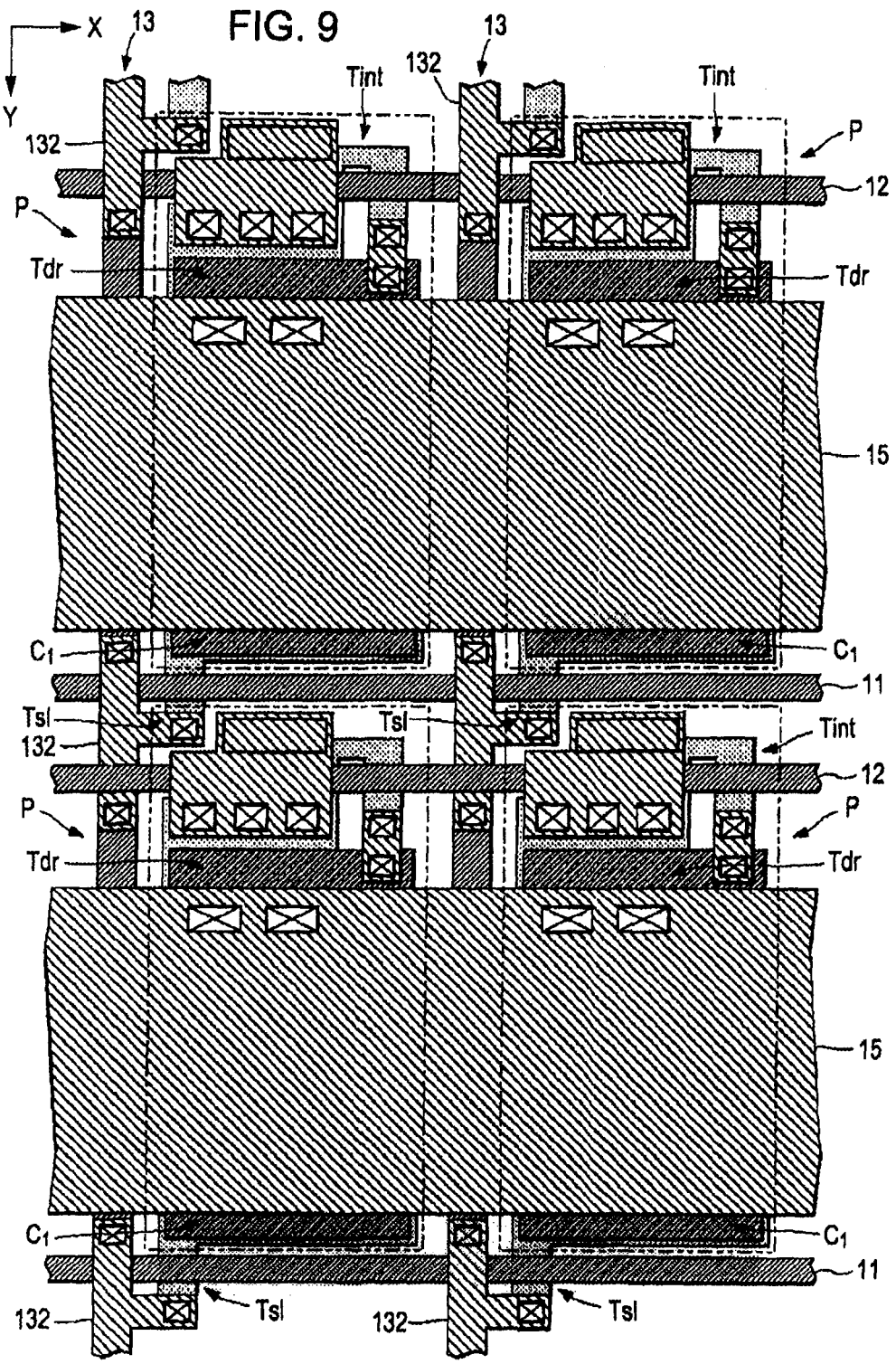
FIG. 9 is a plan view showing a plurality of unit element in a phase where the second insulating layer has been formed.

FIG. 9 is a plan view showing an array of unit elements P in the phase shown in FIG. 7. As shown in FIGS. 7 and 9, the power supply line 15 is a strip-shaped line extending in the X direction along an array of a plurality of unit elements P. When viewed perpendicularly to the substrate 10, the power supply line 15 overlaps both the capacitor C1 and the source region 311s of the driving transistor Tdr of each unit element P. As shown in FIGS. 6 and 7, of the first insulating layer L1, in a region overlapping the source region 311s, a plurality of contact holes Ha4 penetrating the first insulating layer L1 and the gate insulating layer L0 is formed. The contact holes Ha4 are arrayed in the X direction, in which the gate electrode 511 extends. The power supply line 15 is connected to the source region 311s of the driving transistor Tdr via the contact holes Ha4. In this embodiment, the shape and dimensions of the power supply line 15 are chosen so that the power supply line 15 does not overlap the selecting transistor Ts1 (the element portion 411), the selecting line 11, the initializing transistor Tint (the second element portion 312), or the initializing line 12 when viewed perpendicularly to the substrate 10. Furthermore, in this embodiment, the power supply line 15 extends in parallel to the selecting line 11 and the initializing line 12.

The second data-line portion 132 is a portion constituting the data line 13 together with the first data-line portion 131. As shown in FIGS. 7 and 9, the second data-line portion 132 extends in the Y direction in the space between a pair of adjacent power supply lines 15. As shown in FIG. 7, an end portion 132a on the positive Y side (downside) of the second data-line portion 132 overlaps an end portion 131a (refer to FIG. 6) on the negative Y side (upside) of the first data-line portion 131 that is adjacent to the positive Y side of the second data-line portion 132. The end portion 132a and the end portion 131a are connected to each other via a contact hole Ha5 penetrating the first insulating layer L1. Similarly, an end portion 132b on the negative Y side of the second data-line portion 132 and an end portion 131b (refer to FIG. 6) on the positive Y side of the first data-line portion 131 that is adjacent to the negative Y side of the second data-line portion 132 are connected to each other via a contact hole Ha6. As described above, the first data-line portions 131 and the second data-line portions 132 are arrayed alternately along the Y direction and electrically connected to each other, forming the data line 13 linearly extending in the Y direction.

As shown in FIG. 7, a branched portion is formed contiguously with the second data-line portion 132. The branched portion 134 is located opposite to the capacitor C1 with respect to the selecting line 11. The branched portion 134 extends in the X direction and overlaps the element portion 411 of the semiconductor layer 41. The branched portion 134 is electrically connected to the element portion 411 via a contact hole Ha1 penetrating the first insulating layer L1 and the gate insulating layer L0. That is, the selecting transistor Ts1 is electrically connected to the data line 13 via the branched portion 134.

As shown in FIG. 4, the entire surface of the first insulating layer L1 with the second data-line portion 132 and the power supply line 15 formed thereon is covered by a second insulating layer L2. As shown in FIGS. 3 and 4, the first electrode 21 is formed on the surface of the second insulating layer L2. The first electrode 21 is formed of a light-reflecting conductive material, for example, a metal such as aluminum or silver, or an alloy mainly composed of one of these metals. The first electrode 21 is electrically connected to the portion 712 of the conducting portion 71 via a contact hole Ha8 penetrating the second insulating layer L2. That is, the drain region 311d of the driving transistor Tdr is electrically connected to the first electrode 21 of the light-emitting element E via the conducting portion 71. Furthermore, when the second insulating layer L2 is formed of an acrylic resin or a polyimide resin, heat is uniformly transferred to the resin via a power supply line having a high heat conductivity in a process of thermally curing the resin, so that the resin melts. Thus, the surface of the second insulating layer L2 is flattened even further, so that the first electrode 21 formed on the second insulating layer L2 becomes flatter.

As shown in FIGS. 3 and 4, when viewed perpendicularly to the substrate 10, the first electrode 21 overlaps the conducting portion 71, the driving transistor Tdr, and the capacitor C1. As shown in FIGS. 6 and 7, the driving transistor Tdr and the capacitor C1 occupy large areas in the region where the unit element P is formed. Thus, in this embodiment, it is possible to use a large area to form the first electrode 21. Therefore, according to this embodiment, compared with a configuration where the first electrode 21 is formed so as to overlap only the selecting transistor Ts1 and the initializing transistor Tint, a high numerical aperture can be achieved. Furthermore, of the second insulating layer L2, on the surface of a region where the first electrode 21 overlaps the selecting transistor Ts1 and the initializing transistor Tint, variation in height could occur reflecting the shapes of these transistors. According to this embodiment, however, the first electrode 21 is formed over a large flat surface of the region of the second insulating layer L2 overlapping the driving transistor Tdr and the capacitor C1. Thus, defects (e.g., disconnection) of the first electrode 21 or defects of the light-emitting layer 23 due to variation in the height of the second insulating layer L2 can be prevented effectively.

Furthermore, since the power supply line 15 overlaps the capacitor C1 and the source region 311s of the driving transistor Tdr, as shown in FIGS. 4 and 7, the power supply line 15 exists between the first electrode 21 and the source region 311s of the driving transistor Tdr (and the capacitor C1). In this configuration, compared with a configuration where the power supply line 15 does not exist between the first electrode 21 and the driving transistor Tdr, capacitive coupling between the first electrode 21 and the driving transistor Tdr is suppressed. Thus, the effect of change in the potential of one of the first electrode 21 and the driving transistor Tdr on the potential of the other is alleviated. This serves to control the light-emitting element E accurately. Furthermore, since the power supply line 15 is formed so as to cover the driving transistor Tdr and the capacitor C1 in the region where the first electrode 21 is formed, the surface of the first electrode 21 becomes flat.

Furthermore, as shown in FIG. 3, the first electrode 21 overlaps the first data-line portion 131 of the data line 13 when viewed perpendicularly to the substrate 10. Since the power supply line 15 overlaps the first data-line portion 131, as shown in FIGS. 3 and 7, the power supply line 15 exists between the first electrode 21 and the first data-line portion 131. In this configuration, compared with a configuration where the power supply line 15 does not exist between the first electrode 21 and the first data-line portion 131, capacitive coupling between the first electrode 21 and the data line 13 (the first data-line portion 131) is suppressed. Thus, the effect of change in the potential of one of the first electrode 21 and the data line 13 on the potential of the other is alleviated. This serves to control the light-emitting element E accurately.

On the surface of the second insulating layer L2 with the first electrode 21 formed thereon, a wall 25 is formed of an insulating material. The wall 25 is an insulating film having an aperture 251 for each unit element P in association with the first electrode 21. The wall 25 serves to electrically insulate adjacent first electrodes 21 from each other (i.e., to individually control the potentials of the first electrodes 21).

The light-emitting layer 23 is formed contiguously in association with a plurality of unit elements P so as to cover the entirety of the second insulating layer L2 with the wall 25 formed thereon. More specifically, the light-emitting layer 23 includes a portion extending inside the aperture 251 and coming into contact with the first electrode 21 (i.e., a region where light is actually emitted), and a portion located on the surface of the wall 25. Since the first electrodes 21 are formed individually for the light-emitting elements E, even though the light-emitting layer 23 is formed contiguously in association with a plurality of light-emitting elements E, the amount of light emitted by the light-emitting layer 23 is controlled individually for each light-emitting element E. Furthermore, various layers may be laminated on the light-emitting layer 23 to facilitate or improve the efficiency of light emission by the light-emitting layer 23, such as a hole injection layer, a hole transport layer, an electron injection layer, an electron transport layer, a hole blocking layer, or an electron blocking layer.

Figure 11:
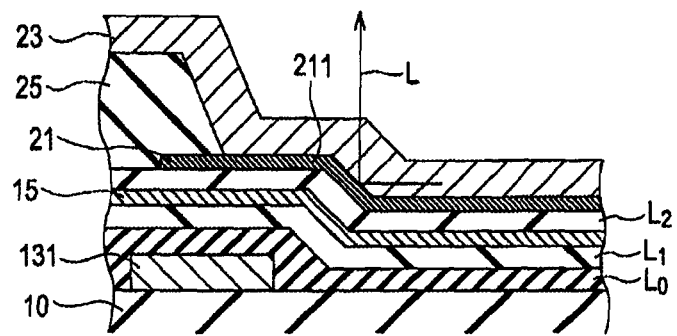
FIG. 11 is a sectional view taken along a line XI-XI in FIG. 3.

FIG. 11 is a sectional view taken along a line XI-XI in FIG. 3. As shown in FIG. 11, the elements covering the first data-line portion 131 of the data line 13 (i.e., the first insulating layer L1, the power supply line 15, and the second insulating layer L2) exhibit variation in height reflecting the thickness of the first data-line portion 131. Since the first electrode 21 is formed as a thin film on the surface of the second insulating layer L2 having such variation in height, of the first electrode 21, a region overlapping the data line 13 forms an inclined surface 211 reflecting the shape of the first data-line portion 131. In this configuration, as indicated by an arrow L in FIG. 11, light emitted from the light-emitting layer 23 in a direction parallel to the substrate 10 is reflected by the inclined surface 211 so that the light is directed to the side opposite to the substrate 10 (i.e., to the viewing side). Thus, compared with a configuration where the entire surface of the first electrode 21 is flat (i.e., a configuration where light emitted from the light-emitting layer 23 in a direction parallel to the substrate 10 is not directed to the viewing side), the light emitted from the light-emitting layer 23 can be used more efficiently.

As shown in FIG. 4, the second electrode 22 is formed contiguously in association with a plurality of unit elements P, and covers the light-emitting layer 23 and the wall 25. Thus, the wall 25 electrically insulates the first electrode 21 and the second electrode 22 from each other in the space between light-emitting elements E. That is, the wall 25 defines a region where a current flows between the first electrode 21 and the second electrode 22 (i.e., a region where light is actually emitted). The second electrode 22 is formed of an optically transparent conductive material, such as indium tin oxide (ITO) or indium zinc oxide (IZO). Thus, light emitted from the light-emitting layer 23 to the side opposite to the substrate 10 and light emitted from the light-emitting layer 23 to the side of the substrate 10 and reflected on the surface of the first electrode 21 are transmitted through the second electrode 22 and output. That is, the light-emitting device D in this embodiment is a top-emission light-emitting device.

Since most optically transparent conductive materials have high resistivities, the second electrode 22 formed of an optically transparent conductive material exhibits a high resistance and therefore exhibits a considerable voltage drop therein along the direction of current. Thus, voltages individually supplied to the associated light-emitting elements E could vary depending on the corresponding positions in the second electrode 22 along the direction of current. This could cause variation in the amount of light (luminance or tone) in the light-emitting regions.

Figure 10:
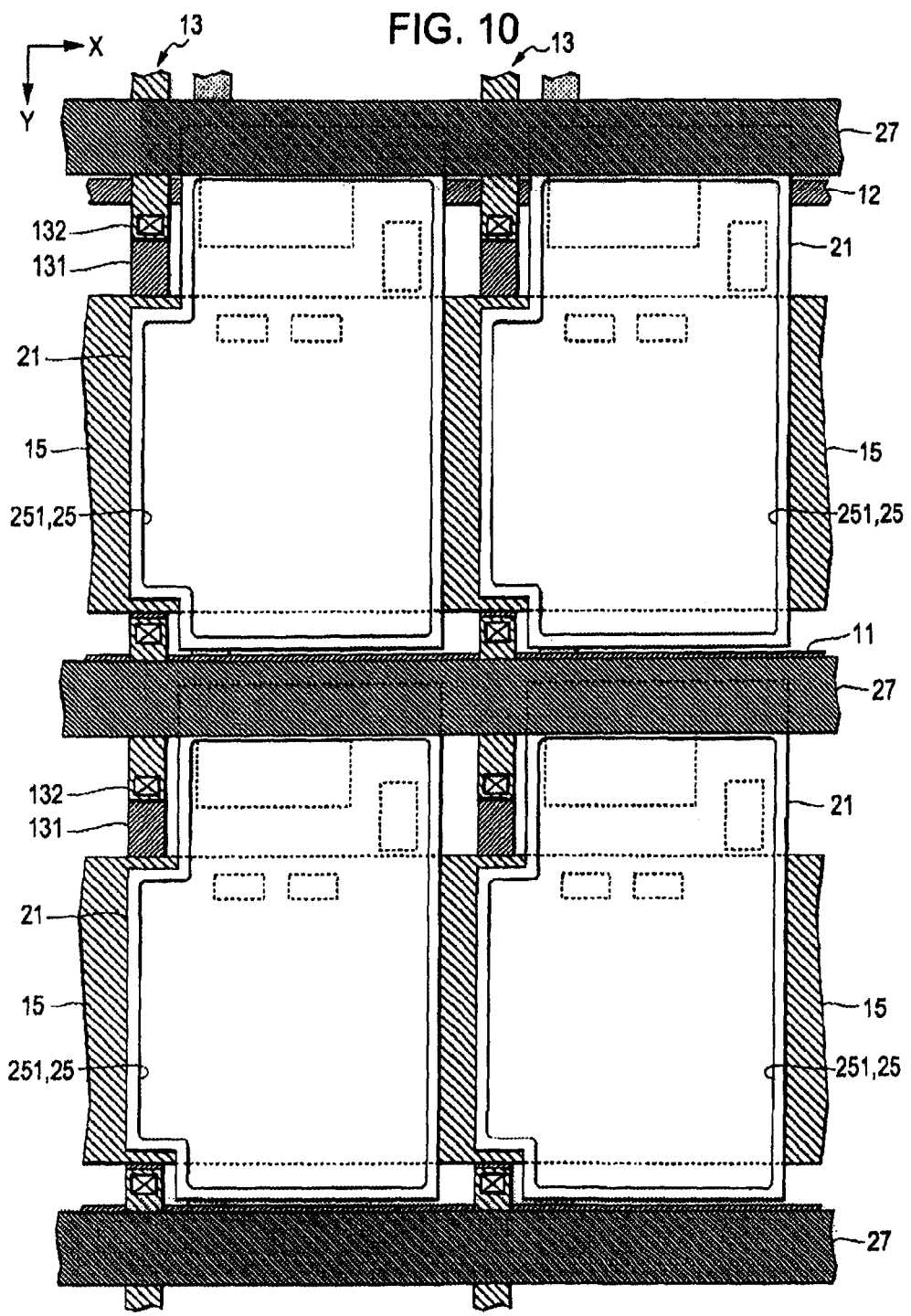
FIG. 10 is a plan view showing a plurality of unit element in a phase where a second electrode has been formed.

In order to suppress the variation in the amount of light, in this embodiment, an auxiliary line 27 that aids electrical conduction in the second electrode 22 is formed. The auxiliary line 27 is formed of a conductive material having a resistivity lower than the resistivity of the material of the second electrode 22, and is electrically connected to the second electrode 22. In FIG. 3, for the purpose of convenience, only the outer shape of the auxiliary line 27 is indicated by a double-dotted line. FIG. 10 is a plan view showing four unit elements P in the phase shown in FIG. 3, arrayed in the X and Y directions. As shown in FIGS. 3 and 10, in this embodiment, when viewed perpendicularly to the substrate 10, the auxiliary line 27 extends in the X direction in the space between unit elements P that are adjacent in the Y direction on the surface of the wall 25 (the region other than the apertures 251), and does not overlap the first electrode 21. Furthermore, as shown in FIG. 4, the auxiliary line 27 is located between the light-emitting layer 23 and the second electrode 22 in contact with the light-emitting layer 23 and the second electrode 22. In the configuration described above, a large portion of current flows through the auxiliary line 27 having a lower resistivity, so that the voltage drop in the second electrode 22 is reduced. Thus, voltages supplied to the individual unit elements P become uniform, so that variation in the amount of light among the individual light-emitting elements E due to the voltage drop can be alleviated effectively. Although most conductive materials having low resistivities, such as the material of the auxiliary line 27, block light (or reflect light), in this embodiment, since the auxiliary line 27 is formed so as not to overlap the first electrode 21, the numerical aperture is not reduced due to the presence of the auxiliary line 27.

Furthermore, since the auxiliary line 27 does not overlap the driving transistor Tdr or the capacitor C1, capacitive coupling between the auxiliary line 27 and the driving transistor Tdr or the capacitor C1 is suppressed. Thus, the effect of change in the potential of one of the auxiliary line 27 and the driving transistor Tdr or the capacitor C1 on the other is alleviated. This serves to control the luminance of the light-emitting element E accurately. On the other hand, when viewed perpendicularly to the substrate 10, the auxiliary line 27 overlaps the selecting transistor Ts1 and the initializing transistor Tint as shown in FIGS. 3 and 10. In this embodiment, however, since the wall 25 exists between the auxiliary line 27 and the selecting transistor Ts1 or the initializing transistor Tint (and also the selecting line 11 or the initializing line 12), compared with a configuration where the wall 25 does not exist between the auxiliary line 27 and the selecting transistor Ts1 or the initializing transistor Tint, capacitive coupling between the auxiliary line 27 and the selecting transistor Ts1 or the initializing transistor Tint is suppressed. Accordingly, in this embodiment, even though the auxiliary line 27 overlaps the selecting transistor Ts1 and the initializing transistor Tint, rounding of the waveform of the selecting signal Sa or the initializing signal Sb is suppressed, so that the selecting transistor Ts1 and the initializing transistor Tint can operate at a high speed. Although the above description has been given in the context of an example where the auxiliary line 27 is located between the light-emitting layer 23 and the second electrode 22, the auxiliary line 27 may be formed on the surface of the second electrode 22 (on the surface opposite to the light-emitting layer 23).

B: Second Embodiment

Next, a specific configuration of a unit element P in a second embodiment of the invention will be described. The electrical configuration of a light-emitting device D in this embodiment is the same as that in the first embodiment (FIGS. 1 and 2). In the following description, elements corresponding to those in the first embodiment are designated by the same signs, and description thereof will be omitted as appropriate.

Figure 12:
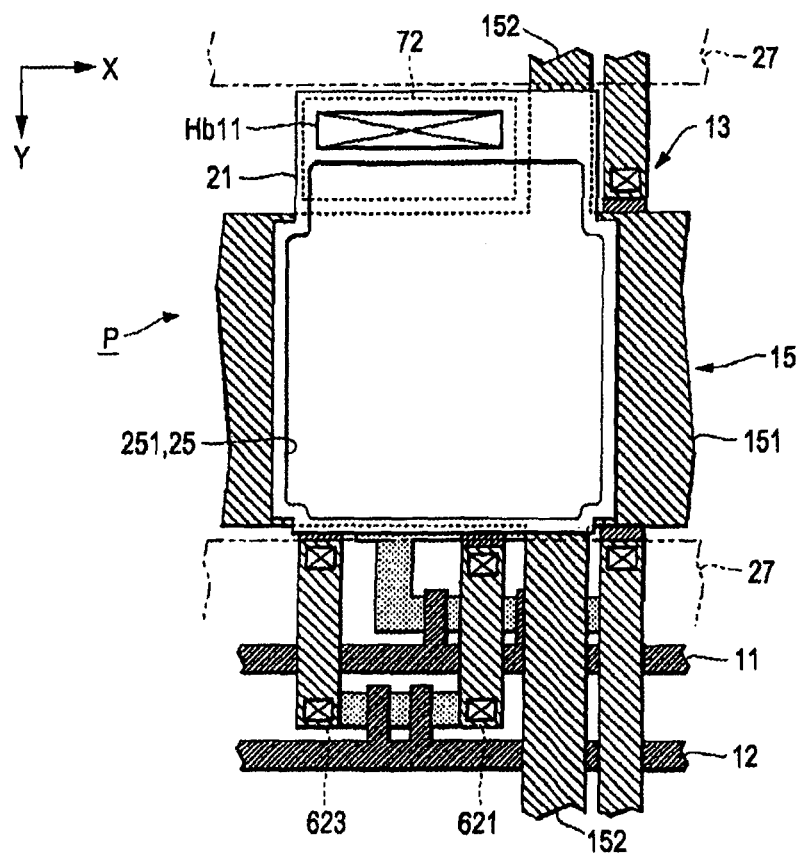
FIG. 12 is a plan view showing a configuration of a unit element in a second embodiment.
Figure 14:
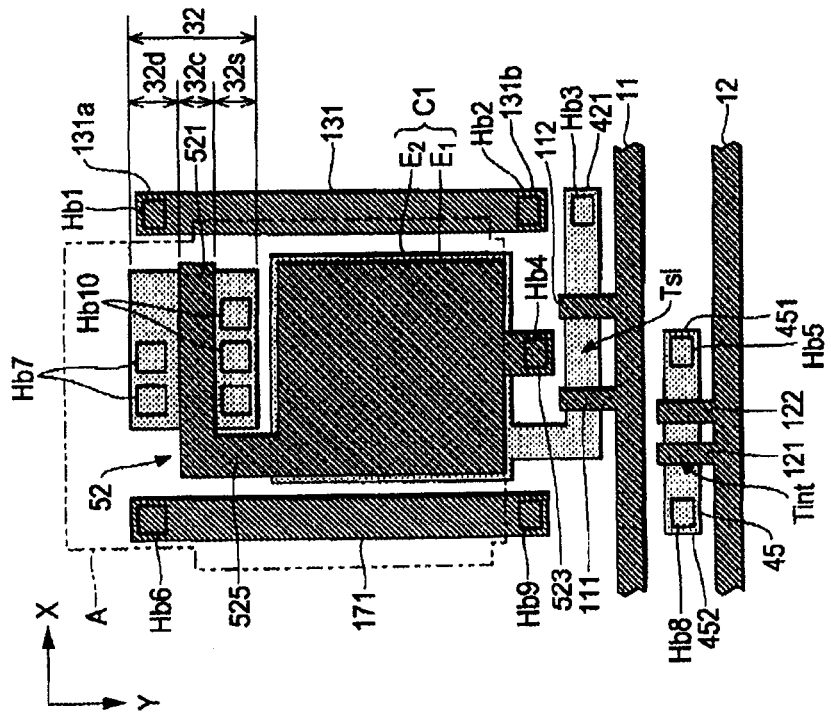
FIG. 14 is a plan view showing a phase where a first insulating layer has been formed.
Figure 13:
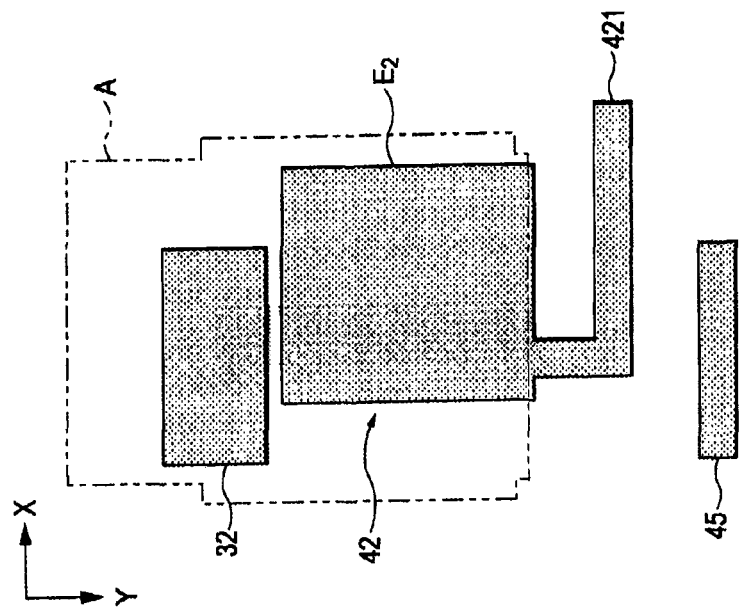
FIG. 13 is a plan view showing a phase where a gate insulating layer has been formed.
Figure 15:
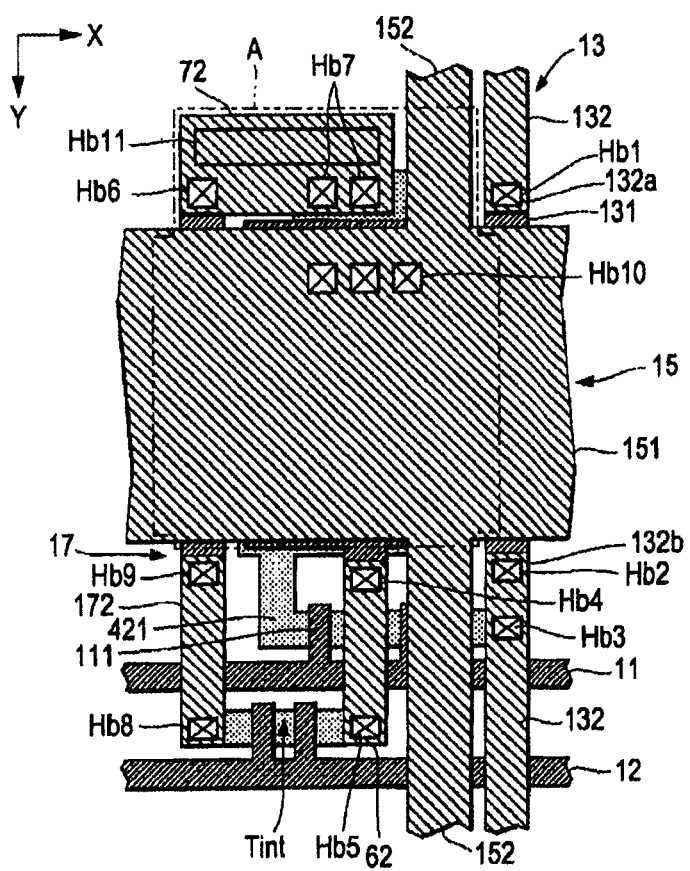
FIG. 15 is a plan view showing a phase where a second insulating layer has been formed.

FIG. 12 is a plan view showing the configuration of a unit element P in this embodiment. FIGS. 13 to 15 are plan views showing the states on the surface of the substrate 10 in different phases of formation of the unit element P shown in FIG. 12. Referring to FIG. 13, on the surface of the substrate 10, a semiconductor layer 32, a semiconductor layer 42, and a semiconductor layer 45 are formed of a semiconductor material out of the same layer. The semiconductor layer 32 is a substantially rectangular region constituting the driving transistor Tdr. The semiconductor layer 42 is a region formed on the positive Y side of the semiconductor layer 32. The semiconductor layer 42 includes a substantially rectangular electrode E2 and an element portion 421 extending in the X direction from a lower left portion of the electrode E2. The element portion 421 functions as a semiconductor layer of the selecting transistor Ts1. The semiconductor layer 45 is a region constituting the initializing transistor Tint. The semiconductor layer 45 extends in the X direction on the side opposite to the semiconductor layer 32 with respect to the semiconductor layer 42.

On the surface of the gate insulating layer L0 covering the elements described above, as shown in FIG. 14, the first data-line portion 131, the selecting line 11, the initializing line 12, an intermediate conductor 52, and a first relaying-line portion 171 are formed out of the same layer. The first data-line portion 131 is a portion constituting the data line 13 as in the first embodiment. The first data-line portion 131 extends in the Y direction on the positive X side of the intermediate conductor 52.

The initializing line 12 has a first gate electrode 121 and a second gate electrode 122 branching from a portion extending in the X direction to the negative Y side and overlapping the semiconductor layer 45. In the semiconductor layer 45, regions respectively overlapping the first gate electrode 121 and the second gate electrode 122 serve as channel regions of the initializing transistor Tint. Similarly, the selecting line 11 has a first gate electrode 111 and a second gate electrode 112 branching from a portion extending in the X direction to the negative Y side and overlapping the element portion 421 of the semiconductor layer 42. The first gate electrode 111 and the second gate electrode 112 are adjacent to each other with a gap therebetween. Of the element portion 421, regions respectively overlapping the first gate electrode 111 and the second gate electrode 112 via the gate insulating layer L0 serve as channel regions of the selecting transistor Ts1. As described above, the selecting transistor Ts1 and the initializing transistor Tint in this embodiment are dual-gate thin-film transistors.

The intermediate conductor 52 includes an electrode E1 opposing the electrode E2 to constitute the capacitor C1, a connecting portion 525 extending from an upper left portion of the electrode E1 to the negative Y side, a gate electrode 521 extending in the positive X side and overlapping the semiconductor layer 32, and a connecting portion 523 projecting from the substantial center in the X direction of the electrode E1 to the positive Y side. The gate electrode 521 extends in the X direction so as to overlap the semiconductor layer 32 along the entire length of the semiconductor layer 32 in the X direction. As shown in FIG. 14, of the semiconductor layer 32, a region opposing the gate electrode 521 via the gate insulating layer L0 serves as a channel region 32c of the driving transistor Tdr. Furthermore, a region on the side of the electrode E1 with respect to the channel region 32c serves as a source region 32s, and a region on the opposite side serves as a drain region 32d.

The first relaying-line portion 171 is a portion constituting a line (hereinafter referred to as a relaying line) for electrically connecting the initializing transistor Tint to the drain region 32d of the driving transistor Tdr. The first relaying-line portion 171 extends in the Y direction on the negative X side of the intermediate conductor 52. That is, in this embodiment, the intermediate conductor 52 is located between the first data-line portion 131 and the first relaying-line portion 171.

On the surface of the first insulating layer L1 covering the elements described above, as shown in FIG. 15, the second data-line portion 132, a connecting portion 62, a second relaying-line portion 172, a conducting portion 72, and the power supply line 15 are formed out of the same layer.

Similarly to the first embodiment, the second data-line portion 132 constitutes the data line 13 together with the first data-line portion 131. More specifically, the second data-line portion 132 extends in the Y direction from an end portion 132a to an end portion 132b. The end portion 132a is electrically connected via a contact hole Hb1 to an upper end portion 131a (refer to FIG. 14) of a first data-line portion 131 that is adjacent to the positive Y side of the second data-line portion 132. The end portion 132b is electrically connected via a contact hole Hb2 to a lower end portion 131b (refer to FIG. 14) of a first data-line portion 131 that is adjacent to the negative Y side of the second data-line portion 132. Furthermore, in this embodiment, the second data-line portion 132 is electrically connected to an end portion of the element portion 421 via a contact hole Hb3 penetrating the first insulating layer L1 and the gate insulating layer L0. That is, the data line 13 is electrically connected to the selecting transistor Ts1 via the contact hole Hb3.

As shown in FIGS. 14 and 15, the connecting portion 62 extends in the Y direction so as to overlap the connecting portion 523 of the intermediate conductor 52 and an end portion 451 on the positive X side of the semiconductor layer 45. The connecting portion 62 is electrically connected to the connecting portion 523 via a contact hole Hb4 penetrating the first insulating layer L1, and is electrically connected to the end portion 451 of the semiconductor layer 45 via a contact hole Hb5 penetrating the gate insulating layer L0. That is, the electrode E1 of the capacitor C1 (and also the gate electrode 521 of the driving transistor Tdr) is electrically connected to the initializing transistor Tint via the connecting portion 62.

The conducting portion 72 is electrically connected to the first relaying-line portion 171 via a contact hole Hb6 penetrating the first insulating layer L1. Similarly to the conducting portion 71 in the first embodiment, the conducting portion 72 is a portion electrically connecting the drain electrode of the driving transistor Tdr to the first electrode 21 of the light-emitting element E. Of the first insulating layer L1, in a region overlapping the drain region 32d, a plurality of contact holes (two contact holes herein) Hb7 penetrating the first insulating layer L1 and the gate insulating layer L0 is formed. The contact holes Hb7 are arrayed in the X direction (i.e., in the direction of the channel width of the driving transistor Tdr), in which the gate electrode 521 extends. The conducting portion 72 is electrically connected to the drain region 32d via the contact holes Hb7.

As shown in FIGS. 14 and 15, the second relaying-line portion 172 extends in the Y direction so as to overlap an end portion 452 on the negative X side of the semiconductor layer 45 and the first relaying-line portion 171. The second relaying-line portion 172 is electrically connected to the end portion 452 via a contact hole Hb8 penetrating the first insulating layer L1 and the gate insulating layer L0, and to the first relaying-line portion 171 via a contact hole Hb9 penetrating the first insulating layer L1. As described above, the initializing transistor Tint is electrically connected to the drain region 321 of the driving transistor Tdr (and also the connecting portion 72) via a relaying line 17 formed of the first relaying-line portion 171 and the second relaying-line portion 172.

Figure 16:
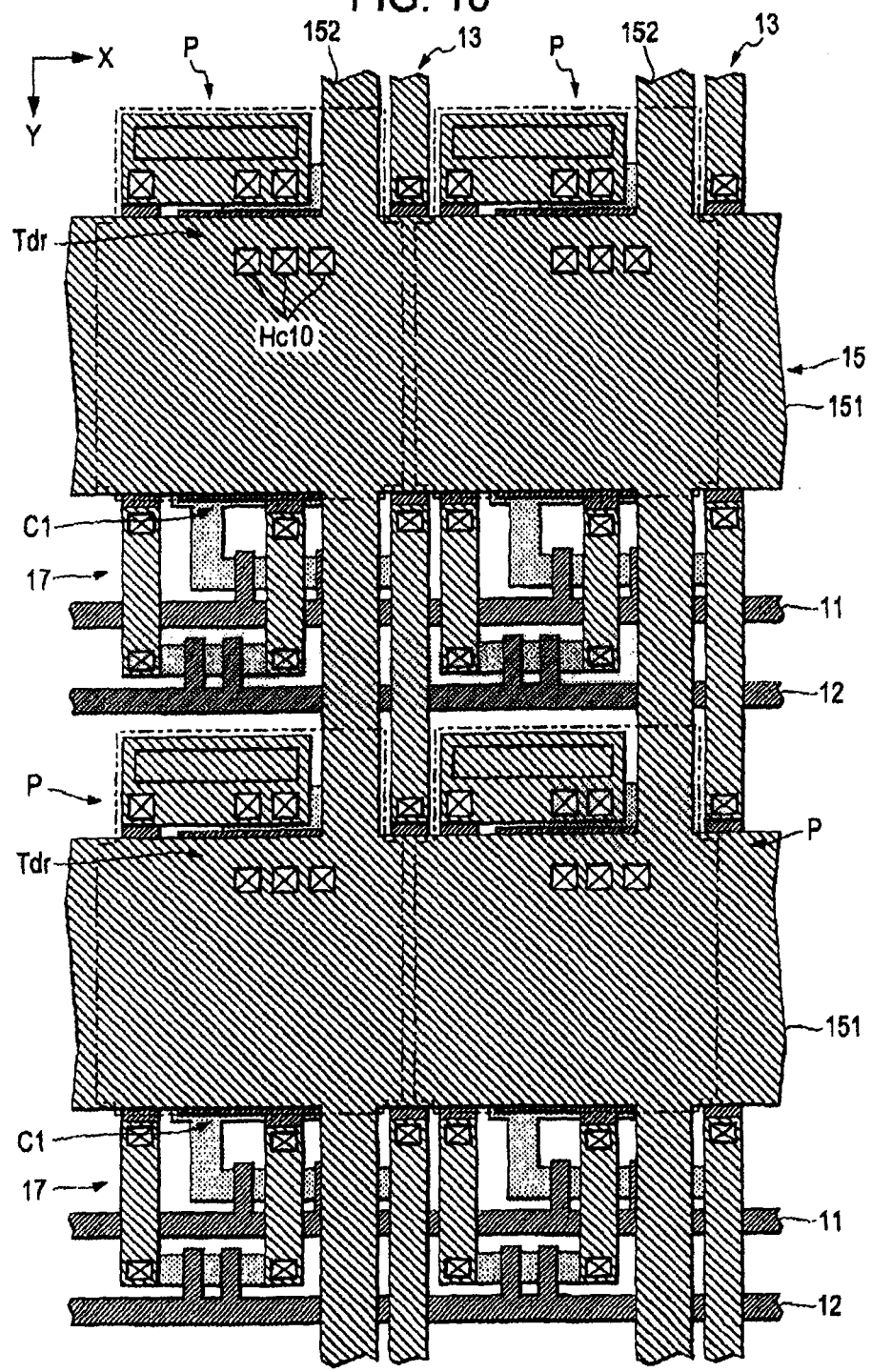
FIG. 16 is a plan view showing a plurality of unit elements in a phase where the second insulating layer has been formed.

FIG. 16 is a plan view showing an array of four unit elements P in the phase shown in FIG. 15. As shown in FIGS. 15 and 16, of the first insulating layer L1, in a region overlapping the source region 32 (refer to FIG. 14) of the semiconductor layer 32, a plurality of contact holes (three contact holes herein) Hb10 penetrating the first insulating layer L1 and the gate insulating layer L0 is formed. The contact holes Hb10 are arrayed in the X direction, in which the gate electrode 521 extends. The power supply line 15 is connected to the source region 32s via the contact holes Hb10.

In this embodiment, the power supply line 15 has a lattice configuration having first portions 151 each extending in the X direction in association with a plurality of unit elements P and second portions 152 each extending in the Y direction in association with a plurality of unit elements P. Each of the first portions 151 extends in the X direction through the space between a pair of adjacent second data-line portions 132 and the space between a second relaying-line portion 172 and a conducting portion 72 (the portion 721 of the conducting portion 72). Thus, when viewed perpendicularly to the substrate 10 as in FIGS. 15 and 16, the first portion 151 overlaps the first data-line portion 131, the first relaying-line portion 171, and the capacitor C1. Furthermore, each of the second portions 152 extends in the Y direction through the space between a conducting portion 72 (the portion 722 of the conducting portion 72) and a second data-line portion 132 and the space between a connecting portion 62 and the second data-line portion 132. However, as shown in FIGS. 15 and 16, the second portion 152 does not overlap the selecting transistor Ts1 or the initializing transistor Tint.

Figure 17:
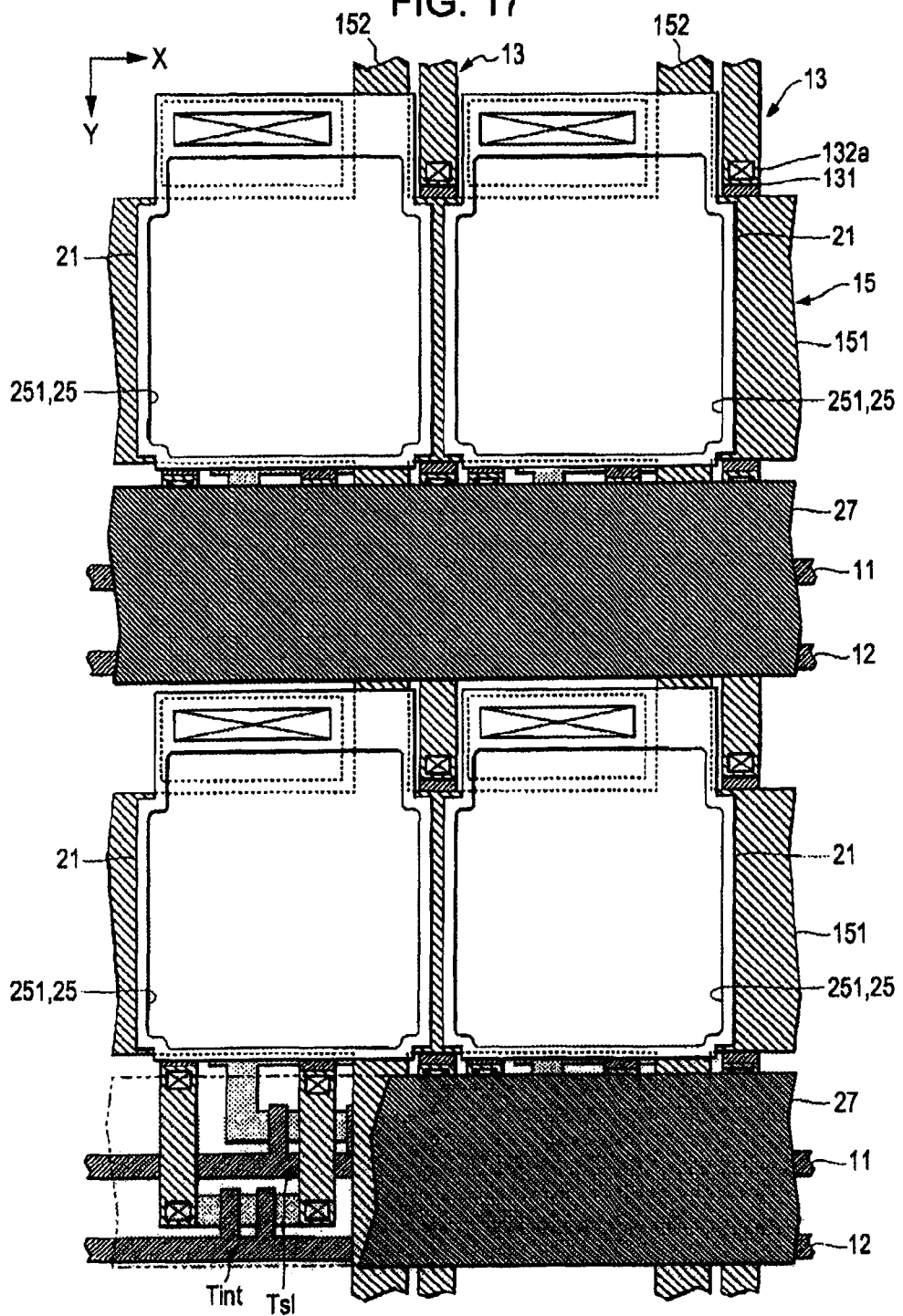
FIG. 17 is a plan view showing a plurality of unit elements in a phase where a second electrode has been formed.
Figure 21:
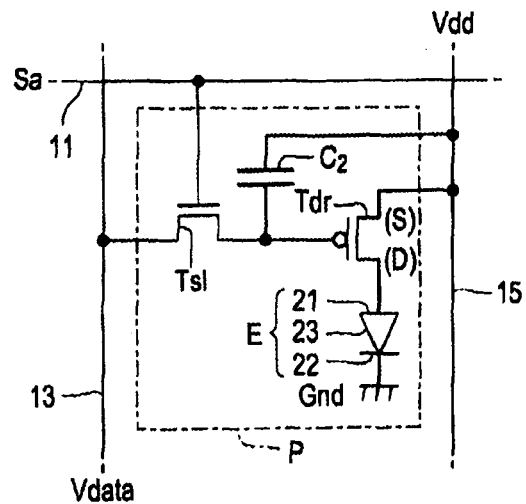
FIG. 21 is a circuit diagram showing an electrical configuration of each unit element in a fourth embodiment.

The first electrode 21 shown in FIG. 21 is formed on the surface of the second insulating layer L2 with the element described above formed thereon. The first electrode 21 is electrically connected to the conducting portion 72 (and also the drain region 32d of the driving transistor Tdr) via a contact hole Hb11. FIG. 17 is a plan view showing an array of unit elements P in the phase shown in FIG. 12. As shown in FIGS. 12 and 17, the first electrode 21 is formed so as not to overlap the driving transistor Tdr, the capacitor C1, or the data line 13 (the first data-line portion 131). In this configuration, the power supply line 15 exists between the first electrode 21 and the driving transistor Tdr or the capacitor C1, and between the first electrode 21 and the first data-line portion 131 of the data line 13. Thus, similarly to the first embodiment, capacitive coupling between the first electrode 21 and the associated elements is suppressed also in this embodiment.

Furthermore, when viewed perpendicularly to the substrate 10 as in FIG. 12, in this embodiment, the first electrode 21 does not overlap the selecting transistor Ts1 or the initializing transistor Tint (or the selecting line 11 or the initializing line 12). On the other hand, as shown in FIGS. 12 and 17, the auxiliary line 27 is formed in the space between the first electrodes 21 on the surface of the wall 25 formed on the surface of the second insulating layer L2, and extends in the X direction so as to overlap the selecting transistor Ts1 and the initializing transistor Tint (and also the selecting line 11 and the initializing line 12). Since the wall 25 exists between the auxiliary line 27 and the selecting transistor Ts1 or the initializing transistor Tint, similarly to the first embodiment, capacitive coupling between the auxiliary line 27 and the selecting transistor Ts1 or the initializing transistor Tint is suppressed. The second electrode 22 is configured the same as in the first embodiment.

From the perspective of merely reducing the resistance of the power supply line 15 or the first electrode 21 or improving the numerical aperture, the power supply line 15 and the first electrode 21 may be formed so as to overlap the selecting transistor Ts1 and the initializing transistor Tint as well as the driving transistor Tdr and the capacitor C1 (this configuration will hereinafter be referred to as a "comparative example"). In the comparative example, however, capacitive coupling could occur between the selecting transistor Ts1 or the selecting line 11 and the power supply line 15 or the first electrode 21 (i.e., a stray capacitance could occur), causing rounding of the waveform of the selecting signal Sa. Similarly, a stray capacitance that occurs between the initializing transistor Tint or the initializing line 12 and the power supply line 15 or the first electrode 21 could cause rounding of the waveform of the initializing signal Sb. Thus, in the comparative example, for example, switching delays could occur in the selecting transistor Ts1 or the initializing transistor Tint.

In contrast, according to this embodiment, the power supply line 15 and the first electrode 21 are formed so as not to overlap the selecting transistor Ts1 or the selecting line 11 and the initializing transistor Tint or the initializing line 12. Thus, stray capacitances that occur between the power supply line 15 or the first electrode 21 and other elements are reduced than in the comparative example. Therefore, according to this embodiment, rounding of the waveforms of the selecting signal Sa and the initializing signal Sb is alleviated, so that high-speed operations of the selecting transistor Ts1 and the initializing transistor Tint are allowed.

C: Third Embodiment

Next, a specific configuration of a light-emitting device D according to a third embodiment of the invention will be described. The embodiments described above are examples in which all the unit elements are arranged on the surface of the substrate 10 with the same layout. In contrast, in this embodiment, the layout of a unit element P differs from the layout of an adjacent unit element P. The configuration of each unit element P in this embodiment is the same as that in the second embodiment. Thus, description of the specific configuration of each unit element P will be omitted as appropriate.

Figure 18:
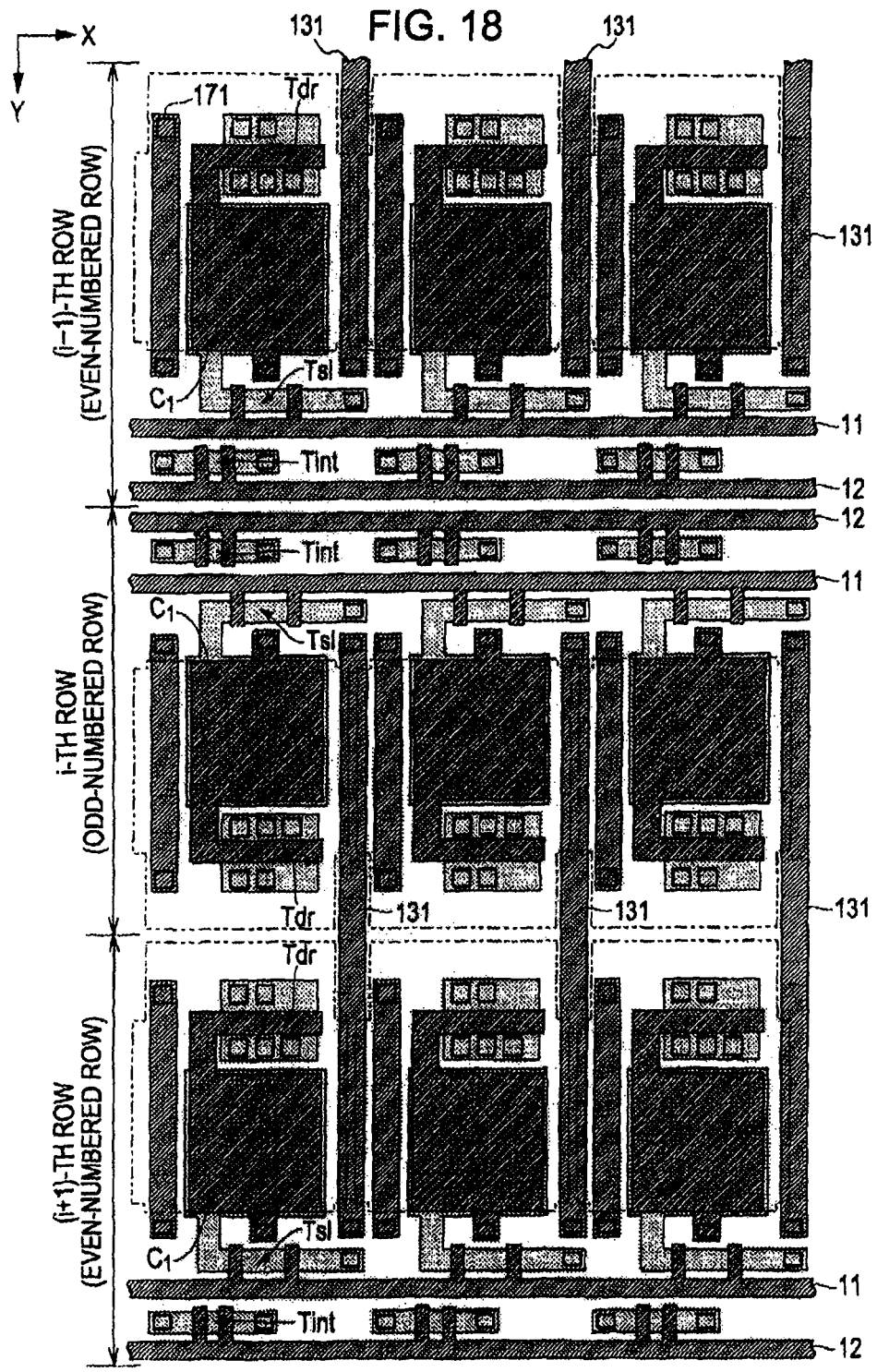
FIG. 18 is a plan view showing a plurality of unit elements in a phase where the first insulating layer has been formed in a third embodiment.

FIG. 18 is a plan view showing nine unit elements P in a phase where the first data-line portion 131, the selecting line 11, and the initializing line 12 have been formed on the surface of the gate insulating layer L0, the nine unit elements P being arrayed in the X and Y directions. In FIG. 18 and subsequent FIGS. 19 and 20, three columns of unit elements P on (i−1)-th to (i+1)-th rows are shown. The i-th row is an odd-numbered row, and the (i−1)-th and (i+1)-th rows are even-numbered rows. As shown in the figures, between the unit elements P on the odd-numbered row (i-th row) and the unit elements P on the even-numbered rows ((i−1)-th and (i+1)-th rows), the layout of elements along the Y direction is opposite.

More specifically, in each of the unit elements P on the even-numbered rows ((i−1)-th and (i+1)-th rows), the selecting transistor Ts1 and the selecting line 11 are located on the positive Y side of the driving transistor Tdr (and the capacitor C1 located on the positive Y side of the driving transistor Tdr). Furthermore, the initializing transistor Tint and the initializing line 12 are located on the positive Y side of the selecting line 11. On the other hand, in each of the unit elements P on the odd-numbered row (i-th row), the selecting transistor Ts1 and the selecting line 11 are located on the negative Y side of the driving transistor Tdr (and the capacitor C1 located on the negative Y side of the driving transistor Tdr). Furthermore, the initializing transistor Tint and the initializing line 12 are located on the negative Y side of the selecting line 11. Thus, as shown in FIG. 18, in the space between each pair of a unit element P on the even-numbered row ((i−1)-th row) and a unit element P on the odd-numbered row (i-th row) adjacent thereto on the positive X side, two sets of the selecting line 11 and the initializing line 12 respectively associated with these unit elements P exist. On the other hand, in the space between each pair of a unit element P on the odd-numbered row (i-th row) and a unit element P on the even-numbered row ((i+1)-th row) adjacent thereto on the positive Y side, the selecting line 11 or the initializing line 12 does not exist.

Of the data line 13, the first data-line portion 131, which is formed out of the same layer as the selecting line 11 and the initializing line 12, is formed linearly and contiguously in association with the unit elements P on the odd-numbered row (i-th row) and the unit elements P on the even-numbered row ((i+1)-th row) adjacent thereto on the positive Y side. That is, the first data-line portion 131 is formed of segments on either side of the selecting line 11 and the initializing line 12 of the even-numbered row ((i−1)-th row) and the selecting line 11 and the initializing line 12 of the odd-numbered row (i-th row) adjacent thereto on the positive Y side.

Figure 19:
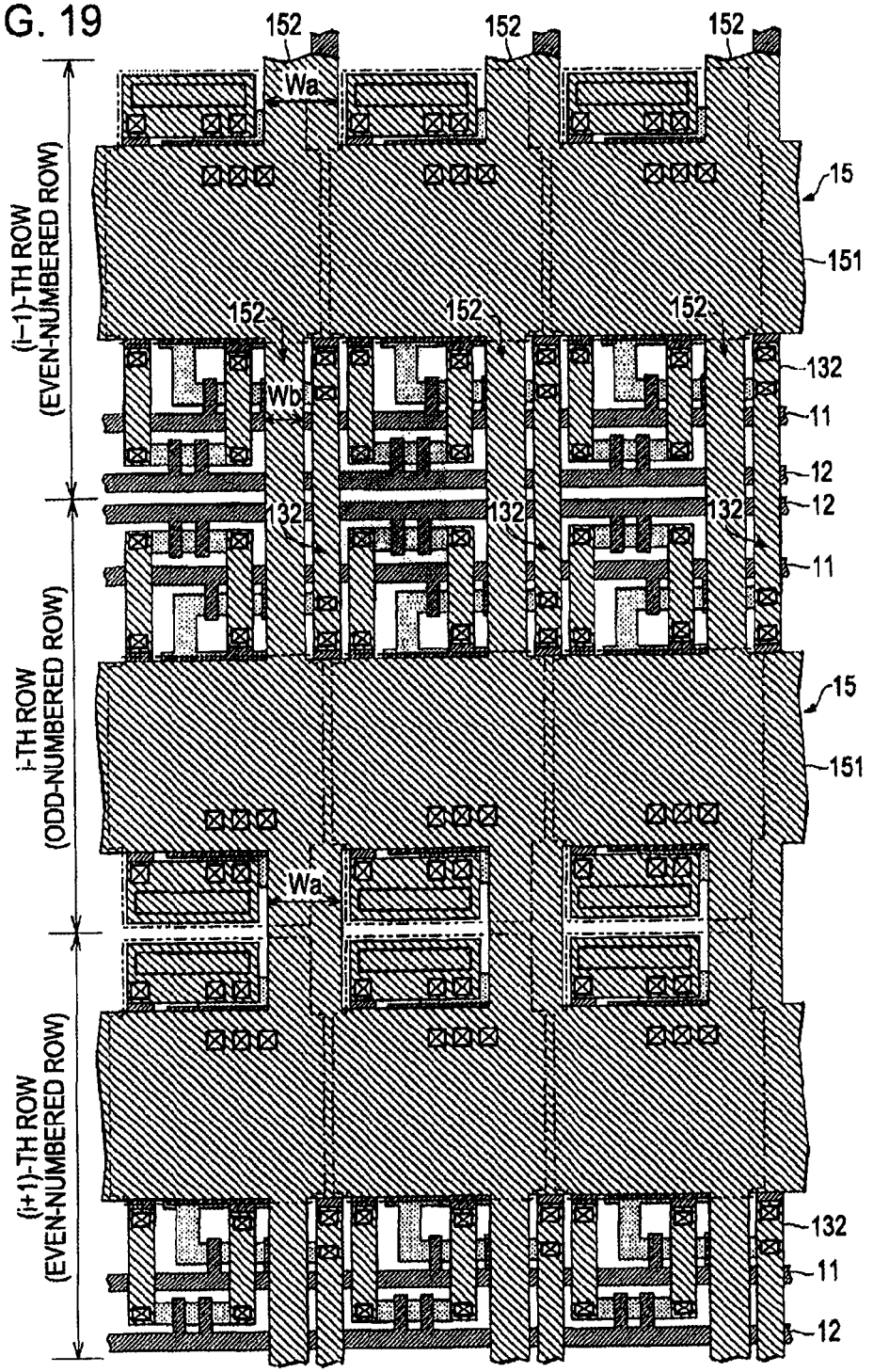
FIG. 19 is a plan view showing a unit element in a phase where a second insulating layer has been formed.

FIG. 19 is a plan view showing unit elements P in a phase where elements (the second data-line portion 132 and the power supply line 15) have been formed on the surface of the first insulating layer L1. As shown in FIG. 19, the second data-line portion 132 is formed so as to cross the selecting line 11 and the initializing line 12 of each of the even-numbered row ((i−1)-th row) and the odd-numbered row (i-th row) located on the positive Y side. The data line 13 is formed by interconnecting the first data-line portions 131 adjacent in the Y direction by the second data-line portions 132. As shown in FIG. 19, the second data-line portion 132 extends in the Y direction adjacently to a second portion 152 of the power supply line 15 formed out of the same layer.

On the other hand, the first data-line portion 131 is formed contiguously in association with the odd-numbered row (i-th row) and the even-numbered row ((i+1)-th row) adjacent thereto on the positive Y side, so that the second data-line portion 132 is not formed in the space between these rows. Thus, in this embodiment, the width of the second portion 152 of the power supply line 15 can be increased correspondingly to the absence of the second data-line portion 132. That is, the width of the second portion 152 extending in association with the odd-numbered row (i-th row) and the even-numbered row ((i+1)-th row) adjacent thereto on the positive Y side is larger than the width Wb of the second portion 152 extending in association with the even-numbered row ((i−1)-th row) and the odd-numbered row (i-th row) adjacent thereto on the positive Y side (Wa>Wb).

Figure 20:
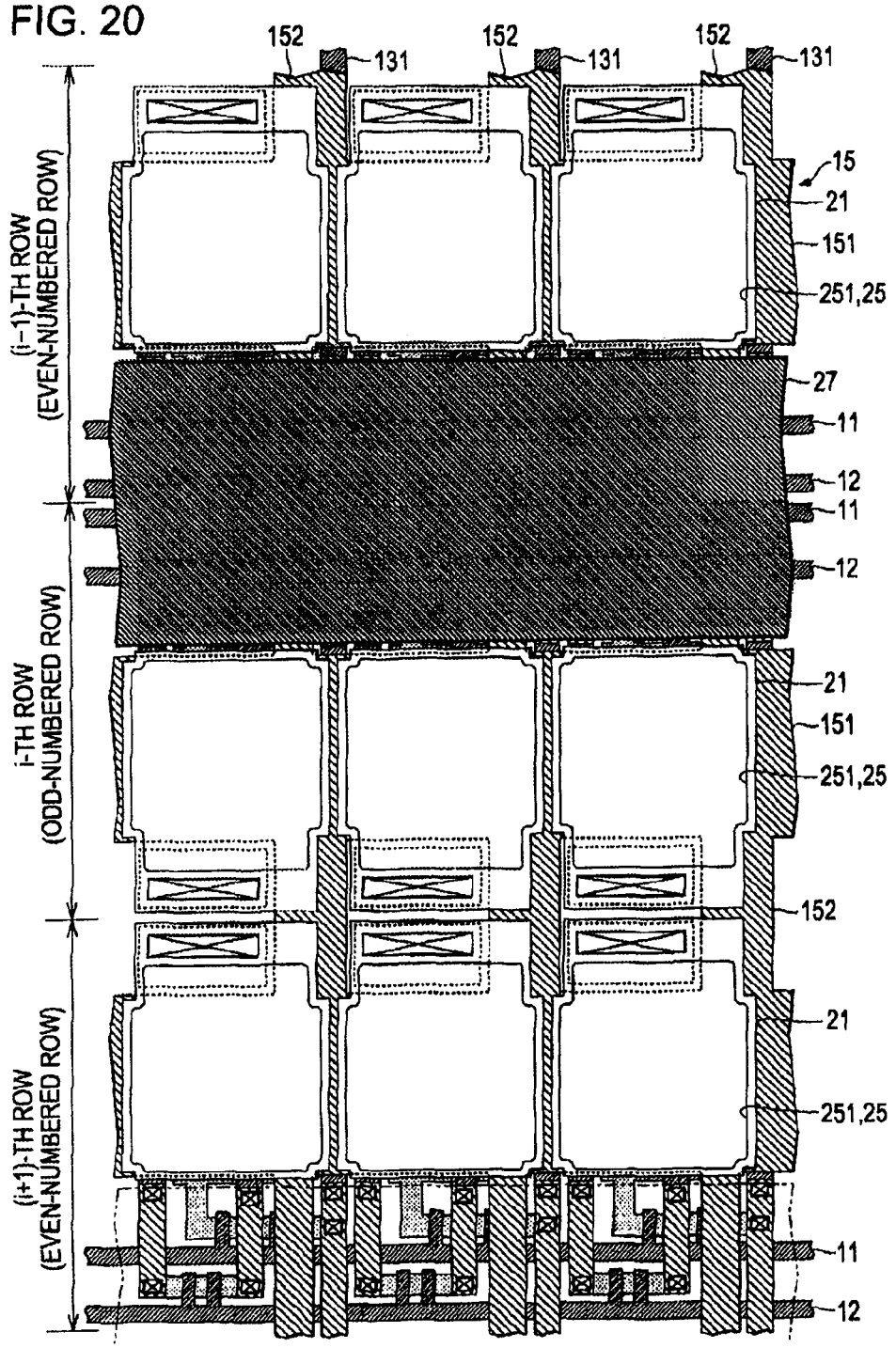
FIG. 20 is a plan view showing a unit element in a phase where a second electrode has been formed.

FIG. 20 is a plan view showing the state where elements (the first electrode 21 and the auxiliary line 27) have been formed on the surface of the second insulating layer L2. As shown in FIG. 20, the auxiliary line 27 formed on the surface of the wall 25 extends in the X direction through the space between the first electrodes 21 on the even-numbered row ((i−1)-th row) and the first electrodes 21 on the odd-numbered row (i-th row) adjacent thereto on the positive Y side, and overlaps the selecting line 11 and the initializing line 12. On the other hand, the first electrodes 21 on the odd-numbered row (i-th row) and the first electrodes 21 on the even-numbered row ((i+1)-th row) adjacent thereto on the positive Y side are located in proximity to each other, and the auxiliary line 27 does not exist between these electrodes. That is, in contrast to the second embodiment, in which one auxiliary line 27 is formed in association with each row of unit elements P, in this embodiment, one auxiliary line 27 is formed in association with each set of two rows of unit elements P.

As described above, according to this embodiment, the number of regions (contact holes Hb1 and Hb2) where the first data-line portion 131 is electrically connected to the second data-line portion 132 can be reduced to about half compared with the second embodiment. Thus, advantageously, the possibility of disconnection of the data line 13 (incomplete connection between the first data-line portion 131 and the second data-line portion 132) can be reduced. Furthermore, since the width of the second portion 152 of the power supply line 15 is increased in regions where the second data-line portion 132 is not needed, the resistance of the power supply line 15 can be reduced compared with the second embodiment. Furthermore, since the auxiliary line 27 is formed with an increased width so as to overlap the selecting lines 11 and the initializing lines 12 associated with two rows, the dimensional precision required for the auxiliary line 27 is lower than that in the second embodiment. Thus, the auxiliary line 27 can be readily formed by low-cost techniques, such as deposition using a mask.

D: Fourth Embodiment

D-1: Electrical Configuration of Light-Emitting Device

Next, a light-emitting device according to a fourth embodiment of the invention will be described. FIG. 21 is a circuit diagram showing the electrical configuration of a unit element P in this embodiment. As shown in FIG. 21, in the unit element P, the capacitor C1 or the initializing transistor Tint (the initializing line 12) in the embodiments described above are not formed, and the electrical connection between the gate electrode of the driving transistor Tdr and the data line 13 is controlled by the selecting transistor Ts1. Furthermore, a capacitor C2 is provided between the gate electrode and source electrode (FIG. 15) of the driving transistor Tdr.

In this configuration, when the selecting transistor Ts1 is turned on, a data voltage Vdata corresponding to a tone specified for the light-emitting element E is supplied from the data line 13 to the gate electrode of the driving transistor Tdr via the selecting transistor Ts1. At this time, charges corresponding to the data voltage Vdata are accumulated in the capacitor C2. Thus, even when the selecting transistor Ts1 is turned off, the gate voltage Vg of the driving transistor Tdr is maintained at the data voltage Ts1. Accordingly, a current corresponding to the gate potential Vg of the driving transistor Tdr (a current corresponding to the data voltage Vdata) is continuously supplied to the light-emitting element E. With this current supplied to the light-emitting element E, the light-emitting element E emits light at a luminance corresponding to the data voltage Vdata.

D-2: Configuration of Unit Element P

Figure 22:
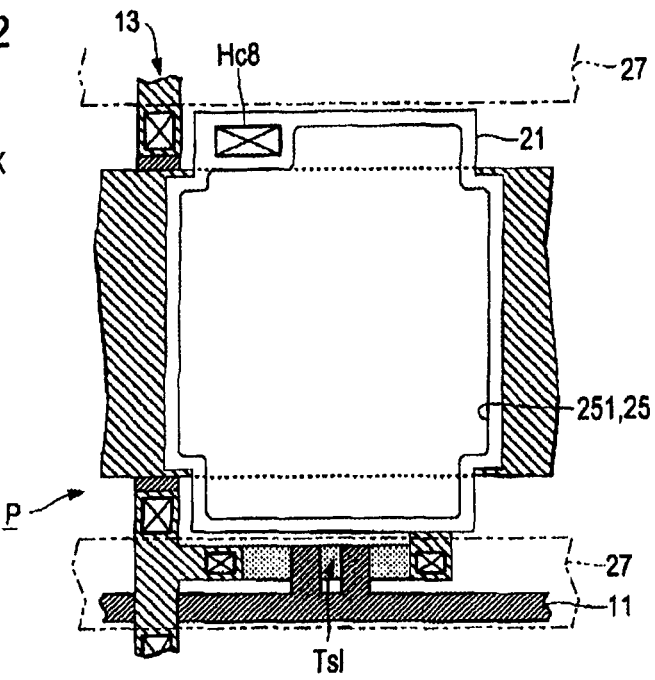
FIG. 22 is a plan view showing a configuration of a unit element.
Figure 23:
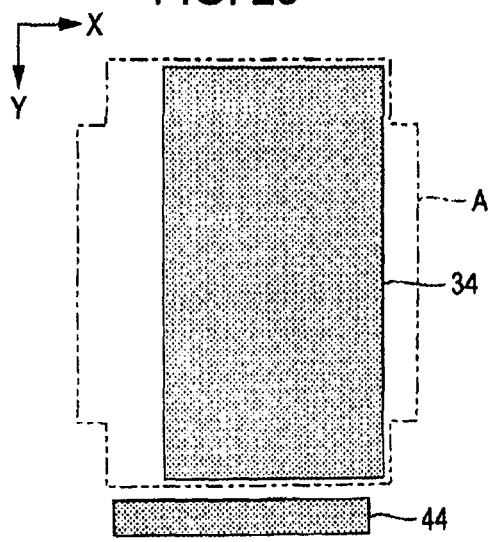
FIG. 23 is a plan view showing a phase where a gate insulating layer has been formed.
Figure 24:
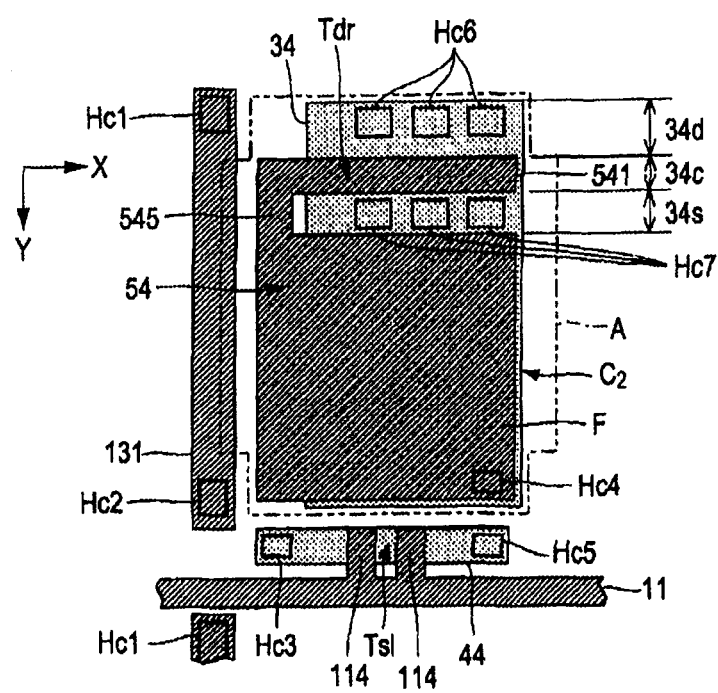
FIG. 24 is a plan view showing a phase where a first insulating layer has been formed.
Figure 25:
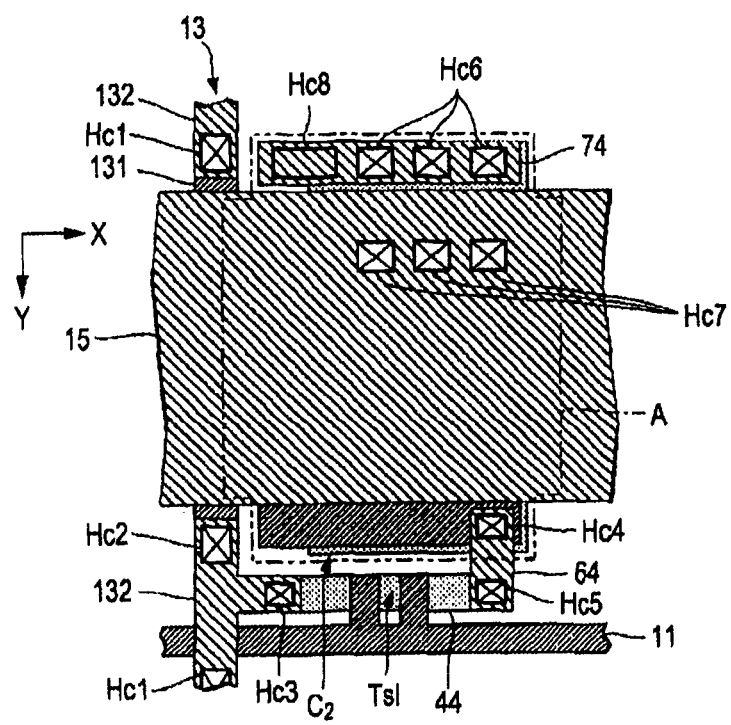
FIG. 25 is a plan view showing a phase where a second insulating layer has been formed.

Next, a specific configuration of the unit element P in this embodiment will be described. FIG. 22 is a plan view showing the configuration of the unit element P. FIGS. 23 to 25 are plan views showing the states on the surface of the substrate 10 in different phases of formation of the unit element P. In FIGS. 23 to 25, an area A where the first electrode 21 shown in FIG. 22 is to be formed is indicated by a double-dotted line.

As shown in FIG. 23, on the surface of the substrate 10, a semiconductor layer 34 and a semiconductor layer 44 are formed of a semiconductor material out of the same layer. The semiconductor layer 34 is a substantially rectangular region constituting the driving transistor Tdr and the capacitor C2. The semiconductor layer 44 extends in the X direction on the positive Y side of the semiconductor layer 34.

As shown in FIG. 24, on the surface of the gate insulating layer L0 covering the semiconductor layer 34 and the semiconductor layer 44, the selecting line 11, the first data-line portion 131, and an intermediate conductor 54 are formed out of the same layer. The selecting line 11 has two gate electrodes 114 branching to the negative Y side from a portion extending in the X direction so as to overlap the semiconductor layer 44. Regions where the gate electrodes 114 oppose the semiconductor layer 44 via the gate insulating layer L0 functions as the dual-gate selecting transistor Ts1. The first data-line portion 131 is a portion constituting the data line 13 shown in FIG. 21. The first data-line portion 131 extends in the Y direction through the space (on the negative X side of the intermediate conductor 54) between a pair of selecting lines 11.

The intermediate conductor 54 includes a substantially rectangular electrode portion F, a connecting portion extending on the negative Y side from the upper left portion of the electrode portion F, and a gate electrode 541 extending on the positive X side from the connecting portion 545 and overlapping the semiconductor layer 34. A region where the electrode portion F and the semiconductor layer 34 oppose each other via the gate insulating layer L0 functions as the capacitor C2. Furthermore, a region of the semiconductor layer 34 opposing the gate electrode 541 via the gate insulating layer L0 serves as a channel region 34c of the driving transistor Tdr. Furthermore, a region of the semiconductor layer 34 on the side of the electrode portion F with respect to the channel region 34c serves as a source region 34s, and a region opposite to the source region 34s serves as a drain region 34d.

On the surface of the first insulating layer L1 covering the elements described above, as shown in FIG. 25, the second data-line portion 132, a connecting portion 64, a conducting portion 74, and the power supply line 15 are formed out of the same layer. The second data-line portion 132 constitutes the data line 13 together with the first data-line portion 131. The second data-line portion 132 is electrically connected to the first data-line portion 131 of a row via a contact hole Hc1, and is connected to the first data-line portion 131 of an adjacent row on the negative Y side via a contact hole Hc2. Furthermore, the second data-line portion 132 is electrically connected to the semiconductor layer 44 via a contact hole Hc3 penetrating the first insulating layer L1 and the gate insulating layer L0.

The connecting portion 64 is a portion electrically interconnecting the selecting transistor Ts1 and the capacitor C2. More specifically, the connecting portion 64 is electrically connected to the electrode portion F of the intermediate conductor 54 via a contact hole Hc4 penetrating the first insulating layer L1, and is electrically connected to the semiconductor layer 44 via a contact hole Hc5 penetrating the first insulating layer L1 and the gate insulating layer L0. Furthermore, the conducting portion 74 is a portion electrically connecting the driving transistor Tdr to the light-emitting element E. The conducting portion 74 is connected to the drain region 34d of the semiconductor layer 34 via a plurality of contact holes Hc6 arrayed in the X direction along the gate electrode 541.

Figure 26:
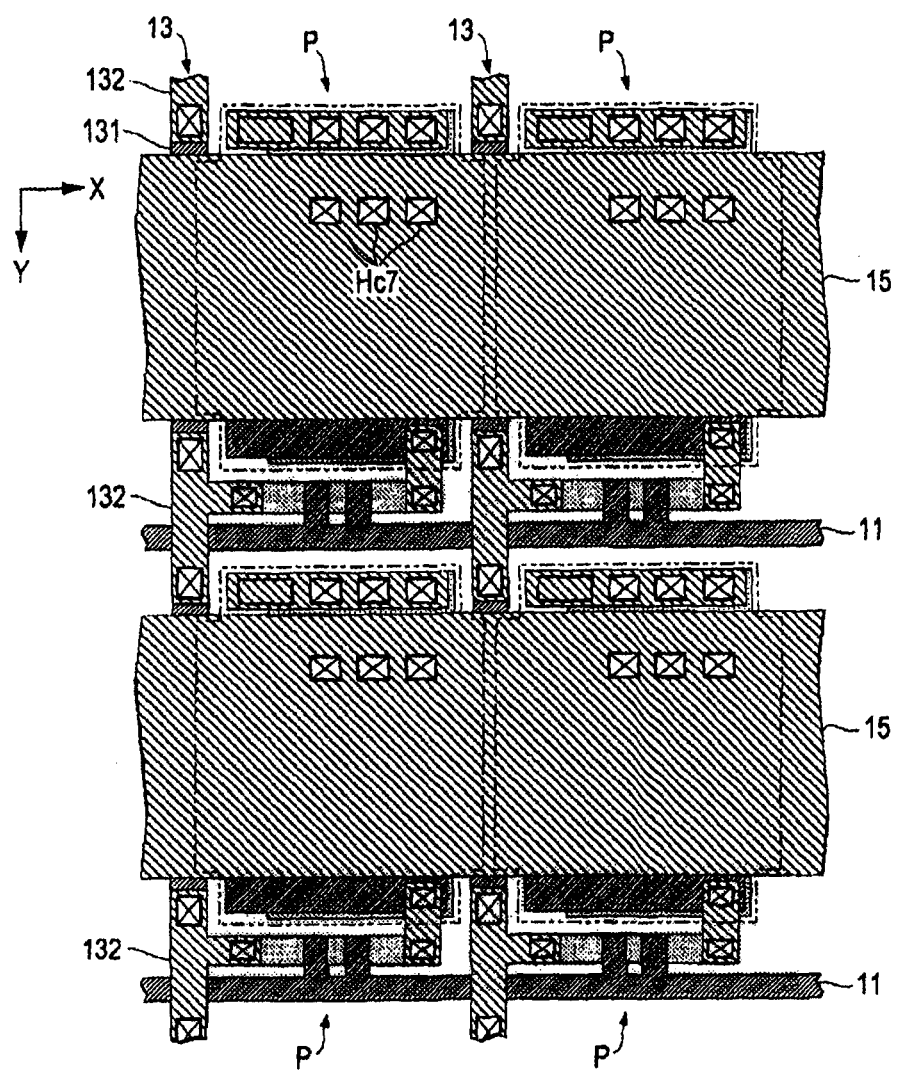
FIG. 26 is a plan view showing a plurality of unit elements in the phase where the second insulating layer has been formed.

FIG. 26 is a plan view showing an array of four unit elements P in the phase shown in FIG. 25. As shown in FIGS. 25 and 26, in this embodiment, the power supply line 15 extends in the X direction in the between each pair of second data-line portions 132 adjacent in the Y direction. The power supply line 15 is electrically connected to the source region 34s of the semiconductor layer 34 via a plurality of contact holes Hc7 penetrating the first insulating layer L1 and the gate insulating layer L0.

Figure 27:
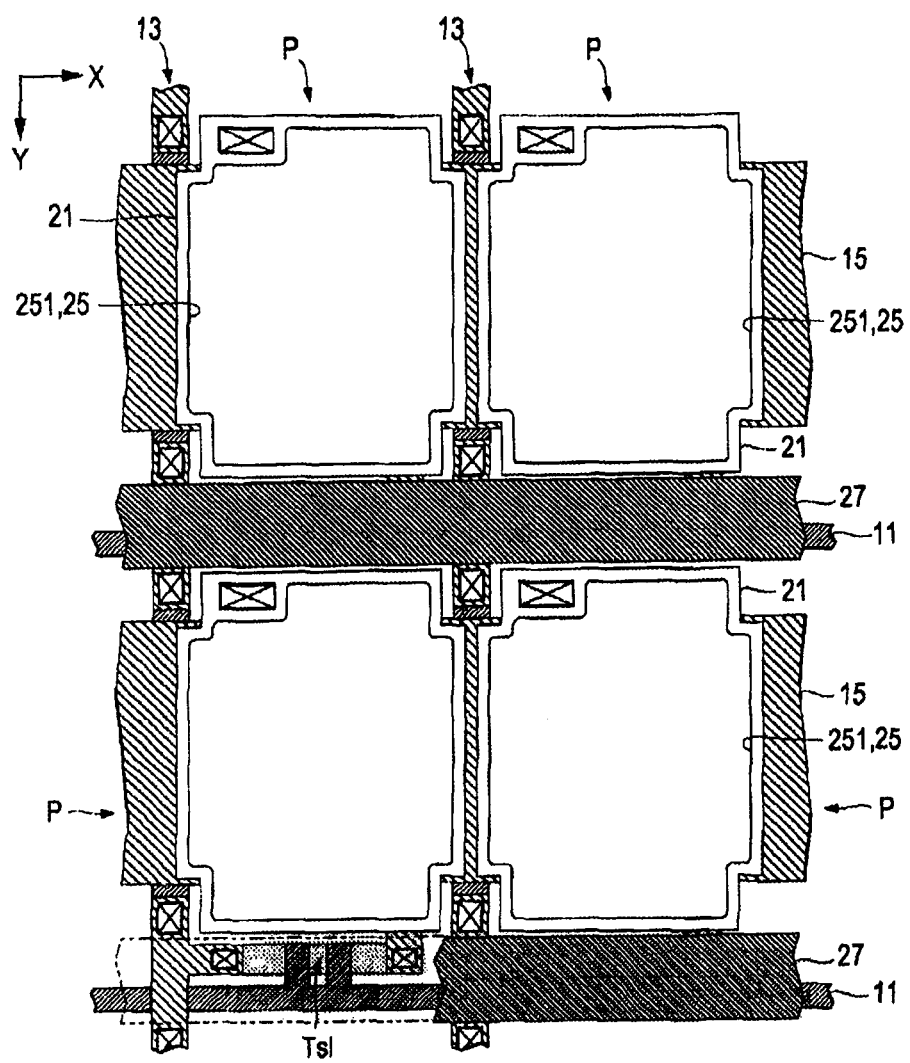
FIG. 27 is a plan view showing a plurality of unit elements in a phase where a second electrode has been formed.

The first electrode 21 shown in FIG. 22 is formed on the surface of the second insulating layer L2 covering the elements described above. The first electrode 21 is electrically connected to the conducting portion 74 via a contact hole Hc8. FIG. 27 is a plan view showing an array of four unit elements P in the phase shown in FIG. 22. As shown in FIGS. 22 and 27, the first electrode 21 is formed so as to overlap the driving transistor Tdr, the capacitor C2, and the data line 13. In this configuration, since the power supply line 15 exists between the first electrode 21 and the driving transistor Tdr or the data line 13, similarly to the first embodiment, capacitive coupling between the first electrode 21 and the driving transistor Tdr or the data line 13 is suppressed. Furthermore, since the first electrode 21 does not overlap the selecting transistor Ts1, capacitive coupling between the first electrode 21 and the selecting transistor Ts1 is suppressed. Furthermore, the contact holes Hc1, Hc8, and Hc6 are arrayed linearly in the X direction, the contact holes Hc2 and Hc4 are arrayed linearly in the X direction, and the semiconductor layer 44 constituting the selecting transistor Ts1 extends in the X direction. Thus, the power supply line 15 can extend in the X direction with a relatively large width.

On the other hand, as shown in FIGS. 22 and 27, the auxiliary line 27 is formed in the space between the first electrodes 21 on the surface of the wall 25 formed on the surface of the second insulating layer L2, and extends in the X direction so as to overlap the selecting transistor Ts1 and the selecting line 11. Since the wall 25 is located between the auxiliary line 27 and the selecting transistor Ts1, capacitive coupling between the auxiliary line 27 and the selecting transistor Ts1 is suppressed. The layout of the second electrode 22 is the same as that in the first embodiment.

E: Fifth Embodiment

Next, a fifth embodiment of the invention will be described. In this embodiment, the layout of a unit element P differs from the layout of a unit element P adjacent thereto in the X direction and the layout of a unit element P adjacent thereto in the Y direction. The configuration of each unit element P is the same as that in the fourth embodiment. Thus, description of the specific configuration of each unit element P will be omitted as appropriate.

Figure 28:
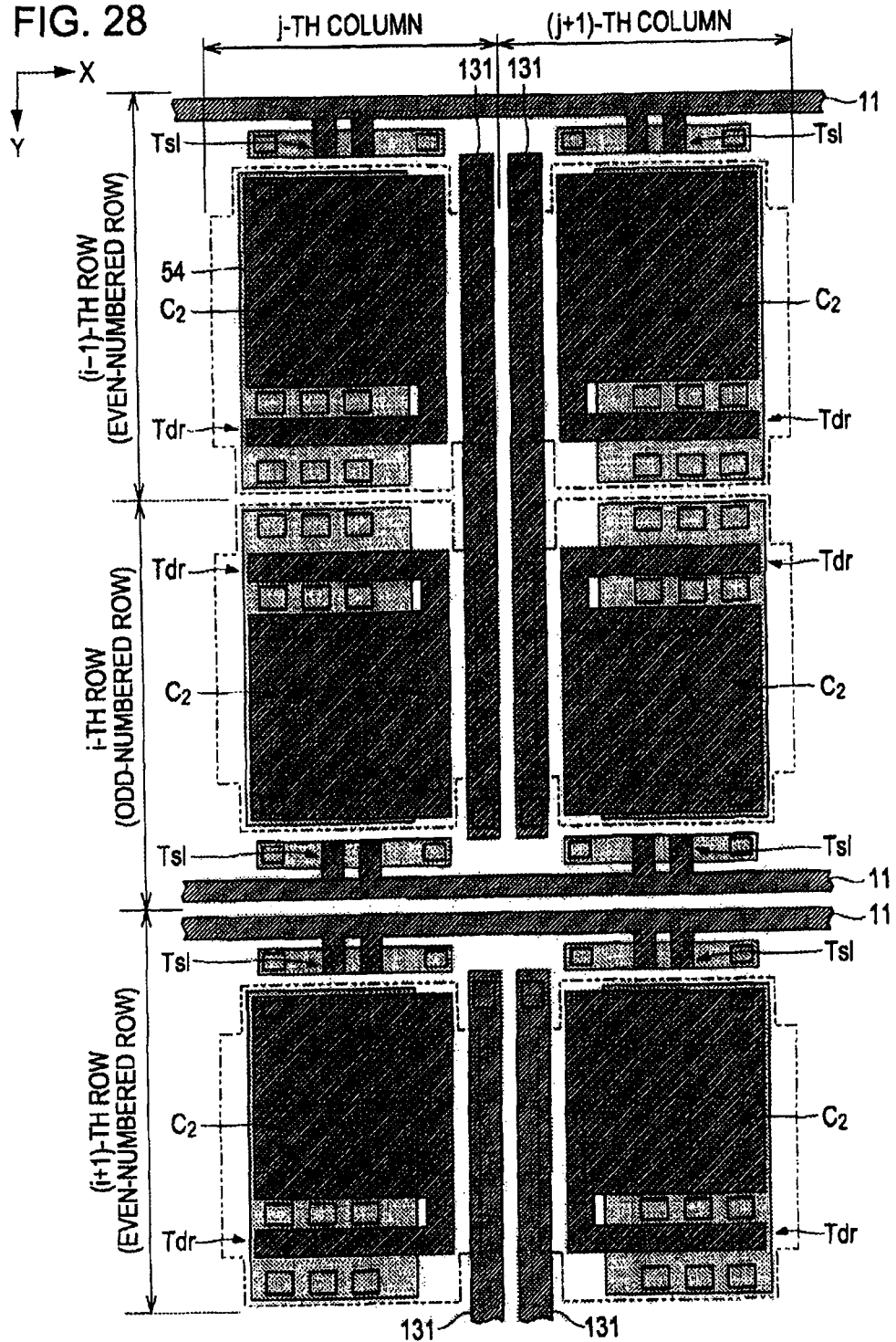
FIG. 28 is a plan view showing a plurality of unit elements in a phase where a first insulating layer has been formed in a fifth embodiment.

FIG. 28 is a plan view showing a plurality of unit elements P in the phase where the first data-line portion 131, the selecting line 11, and the intermediate conductor 54 have been formed out of the same layer, the unit elements P being arrayed in the X and Y directions. In FIG. 28, an i-th row is an odd-numbered row, and (i−1)-th and (i+1)-th rows are even-numbered rows.

In the configuration shown in FIG. 28, similarly to the third embodiment, the layout of elements of the unit elements P is opposite in the Y direction between the odd-numbered row (i-th row) and the even-numbered rows ((i−1)-th and (i+1)-th rows). More specifically, in each of the unit elements P on the odd-numbered row (i-th row), the selecting transistor Ts1 and the selecting line 11 are located on the positive Y side of the driving transistor Tdr. On the other hand, in each of the unit elements P on the even-numbered rows ((i−1)-th and (i+1)-th rows), the selecting transistor Ts1 and the selecting line 11 are located on the negative Y side of the driving transistor Tdr. The first data-line portion 131 is formed contiguously in association with a unit element P on the even-numbered row ((i−1)-th row) and a unit element P on the odd-numbered row (i-th row) adjacent thereto on the positive Y side.

Furthermore, in this embodiment, the layout of the elements of unit elements P is the opposite in the X direction between a j-th column and a (j+1)-th column adjacent in the X direction. More specifically, in each of the unit elements on the j-th column, the first data-line portion 131 is located on the positive X side of the driving transistor Tdr or the capacitor C2. On the other hand, in each of the unit elements P on the (j+1)-th column, the first data-line portion 131 is located on the negative X side of the driving transistor Tdr or the capacitor C2. Thus, the driving transistor Tdr or the capacitor C2 does not exist in the space between the first data-line portion 131 of the j-th column and the first data-line portion 131 of the (j+1)-th column.

Figure 29:
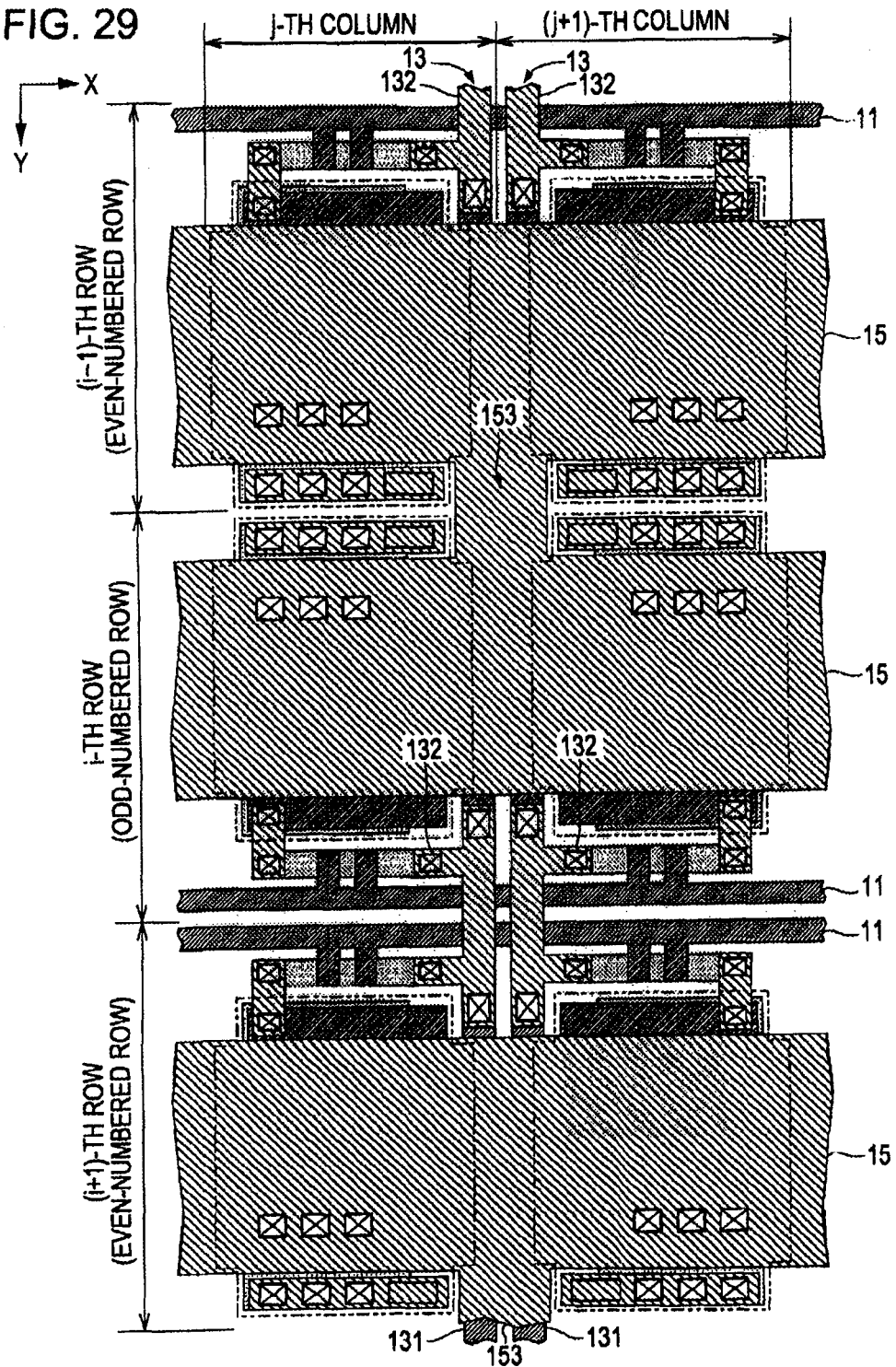
FIG. 29 is a plan view showing a plurality of unit elements in a phase where a second insulating layer has been formed.

FIG. 29 is a plan view showing the state where elements (the second data-line portion 132 and the power supply line 15) have been formed on the surface of the first insulating layer L1. As shown in FIG. 29, the second data-line portion 132 crosses the selecting line 11 of the odd-numbered row (i-th row) and the selecting line 11 of the even-numbered row ((i+1)-th row) adjacent thereto on the positive Y side. On the other hand, the second data-line portion 132 is not formed in the space between the even-numbered row ((i−1)-th row) and the odd-numbered row (i-th row) adjacent thereto on the positive Y side.

Furthermore, in this embodiment, in addition to portions extending in the X direction so as to overlap the capacitors C2 of the unit elements P, the power supply line 15 includes connecting portions 153 interconnecting these portions. Each of the connecting portions 153 is formed in a space between the even-numbered row ((i−1)-th row) and the odd-numbered row (i-th row) adjacent thereto on the positive Y side and overlapping the first data-line portions 131 of the j-th column and the (j+1)-th column (i.e., a region where the second data-line portion 132 is not formed). Thus, according to this embodiment, the area of the power supply line 15 is increased by the area of the connecting portions 153 compared with the fourth embodiment. Accordingly, the resistance of the power supply line 15 is reduced, so that variation in the power-supply potential Vdd at the individual unit elements P can be alleviated.

Figure 30:
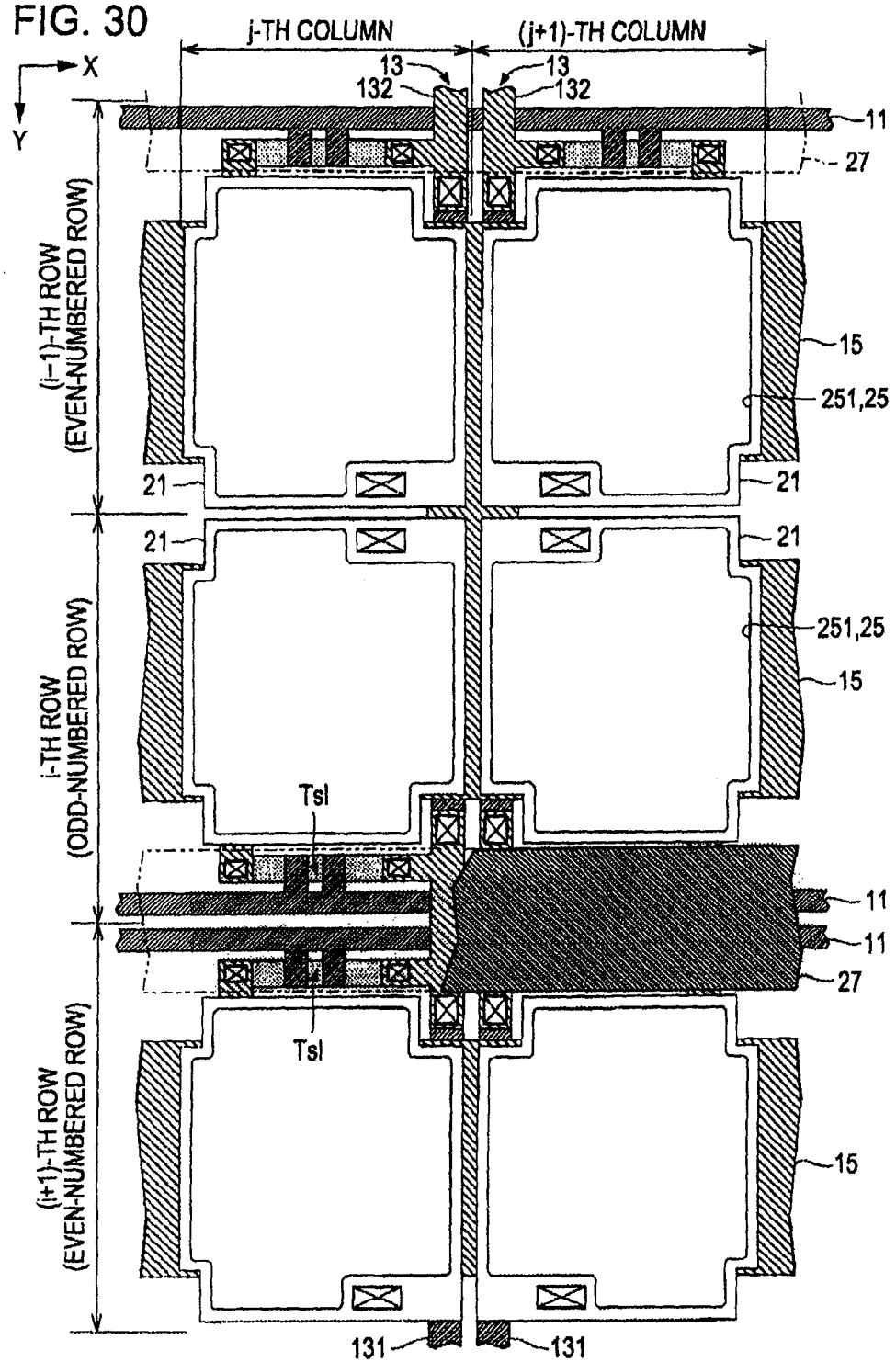
FIG. 30 is a plan view showing a plurality of unit elements in a phase where a second electrode has been formed.

FIG. 30 is a plan view showing the state where elements (the first electrode 21 and the auxiliary line 27) have been formed on the surface of the second insulating layer L2. As shown in FIG. 30, the auxiliary line 27 formed on the surface of the wall 25 extends in the X direction through the space between the first electrode 21 of the odd-numbered row (i-th row) and the first electrode 21 of the even-numbered row ((i+1)-th row) adjacent thereto on the positive Y side, and overlaps the selecting lines 11 and the selecting transistors Ts1 of these rows. On the other hand, the auxiliary line 27 is not formed in the space between the even-numbered row ((i−1)-th row) and the odd-numbered row (i-th row) (i.e., the region where the selecting line 11 or the selecting transistor Ts1 is not formed). According to this embodiment, operation and advantage similar to those in the third embodiment can be achieved.

F: Modifications

Various modifications of the embodiments described above are possible. Specific examples of such modifications are described below. These modifications may be implemented in combination as appropriate.

F-1: First Modification

The electrical configuration of the unit element P in the embodiment described above may be modified as appropriate. Specific examples of modification of the unit element P will be described below.

Figure 31:
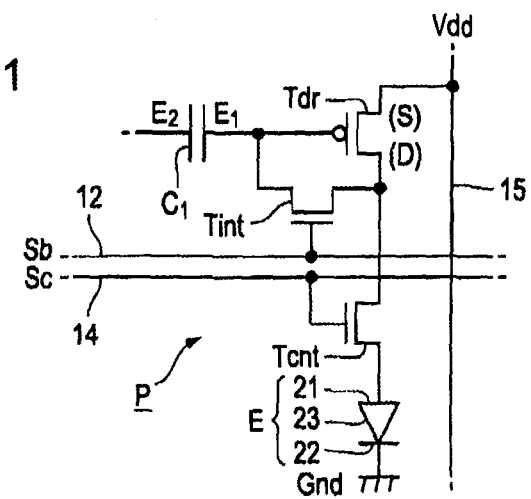
FIG. 31 is a circuit diagram showing a configuration of a unit element according to a modification.

(1) As shown in FIG. 31, a transistor (hereinafter referred to as a "light-emission controlling transistor") Tcnt may be provided between the driving transistor Tdr and the light-emitting element E. The light-emission controlling transistor Tcnt is a switching element that controls the electrical connection between the drain electrode of the driving transistor Tdr and the first electrode 21 of the light-emitting element E according to a light-emission control signal Sc supplied to a light-emission control line 14. When the light-emission controlling transistor Tcnt is turned on, a path of a current from the power supply line 15 to the light-emitting element E is formed, whereby emission of light by the light-emitting element E is enabled. On the other hand, when the light-emission controlling transistor Tcnt is turned off, the path is disconnected to disable emission of light by the light-emitting element E. Thus, it is possible to precisely define a period in which the light-emitting element E actually emits light. For example, it is possible to turn on the light-emission controlling transistor Tcnt so that the light-emitting element E emits light only in active periods not including initializing periods and writing periods. The light-emission controlling transistor Tcnt may be added to the unit element P having the configuration shown in FIG. 21.

The layout of the light-emission controlling transistor Tcnt and the light-emission control line 14 described above may be determined similarly to the example layouts of the selecting transistor Ts1 and the selecting line 11 (or the initializing transistor Tint and the initializing line 12) according to the embodiments described above.

Figure 32:
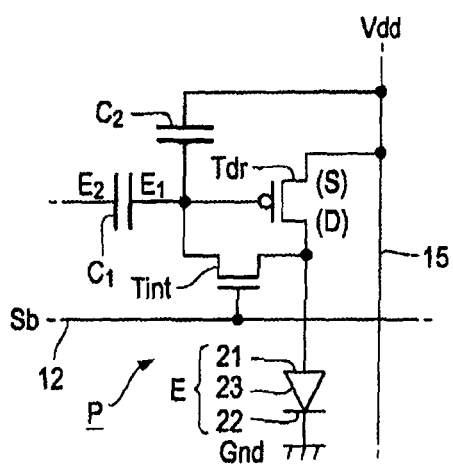
FIG. 32 is a circuit diagram showing a configuration of a unit element according to a modification.

(2) As shown in FIG. 32, in the example of unit element P shown in FIG. 2, the capacitor C2 may be provided between the gate electrode and the source electrode (the power supply line 15) of the driving transistor Tdr. According to this configuration, advantageously, a gate potential Vg of the driving transistor Tdr set in a writing period can be maintained by the capacitor C2 in a driving period. However, in a configuration where a sufficient area is allocated for the gate electrode of the driving transistor Tdr (i.e., for the channel region), the gate potential Vg is maintained by the gate capacitor of the driving transistor Tdr. Thus, it is possible to maintain the gate potential Vg in a driving period even in the configurations according to the first to third embodiments, where the capacitor C2 is not provided.

As described above, the capacitor connected to the gate electrode of the driving transistor Tdr may be the capacitor C1 for setting a gate potential Vg of the driving transistor Tdr by capacitive coupling, or the capacitor C2 for maintaining a potential of the gate electrode of the driving transistor Tdr.

F-2: Second Modification

In the examples described above, the first electrode 21 is composed of a light-reflecting material. Alternatively, the configuration may be such that light emitted from the light-emitting layer 23 to the side of the substrate 10 is reflected to the side opposite to the substrate 10 by a reflecting layer separate from the first electrode 21. In this configuration, a reflecting layer is formed of a light-reflecting material on the surface of the first insulating layer L1, and the first electrode 21 is formed so as to cover the reflecting layer. The first electrode 21 is formed of an optically transparent conductive material, such as ITO or IZO. Furthermore, although the second electrode 22 is formed of an optically transparent material in the examples described above, light emitted from the light-emitting layer 23 can be transmitted even when the second electrode 22 is implemented by a sufficiently thin electrode formed of a light-blocking or light-reflecting conductive material.

Furthermore, according to the invention, it is also possible to implement bottom-emission light-emitting devices, in which light emitted from the light-emitting layer 23 is output through the substrate 10. In this case, for example, the second electrode 22 is formed of a light-reflecting conductive material, and the first electrode 21 is formed of an optically transparent conductive material. In this configuration, light emitted from the light-emitting layer 23 to the side of the substrate 10 and light emitted from the light-emitting layer 23 to the side opposite to the substrate 10 and reflected on the surface of the second electrode 22 are transmitted through the first electrode 21 and the substrate 10 and output.

F-3: Third Modification

In the examples described above, the light-emitting layer 23 is formed contiguously in association with a plurality of unit elements P. Alternatively, the light-emitting layer 23 may be formed separately in association with each unit element P. For example, the configuration may be such that the light-emitting layer 23 is formed only inside each aperture defined by the wall 25. Furthermore, the wall 25 may be omitted as appropriate.

F-4: Fourth Modification

In the examples described above, the light-emitting element E includes the light-emitting layer 23 composed at least of an organic EL material. However, other types of light-emitting elements may be used, such a light-emitting element including a light-emitting layer composed at least of an inorganic EL material, or a light-emitting diode (LED). According to the invention, it suffices for a light-emitting element to emit light using electric energy (typically a current) supplied thereto, regardless of its specific configuration or material.

G: Example Applications

Figure 33:
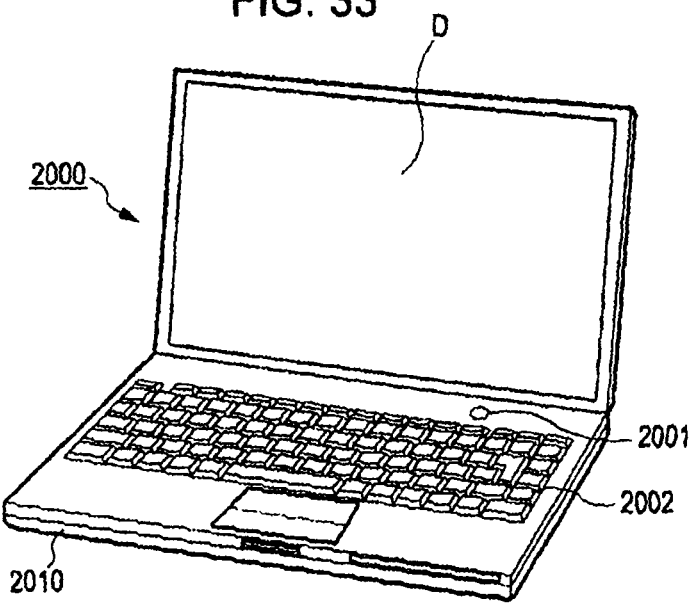
FIG. 33 is a perspective view of a personal computer, which is an example of an electronic apparatus according to the invention.

Next, specific examples of electronic apparatuses including the light-emitting devices described above will be described. FIG. 33 is a perspective view showing the configuration of a mobile personal computer including one of the light-emitting devices D described above. A personal computer 2000 includes the light-emitting device D as a display, and a main unit 2010. Since the light-emitting device D uses the light-emitting layer 23 composed of an organic EL material in the light-emitting element E, it is possible to display an easily viewable screen with a wide viewing angle.

Figure 34:
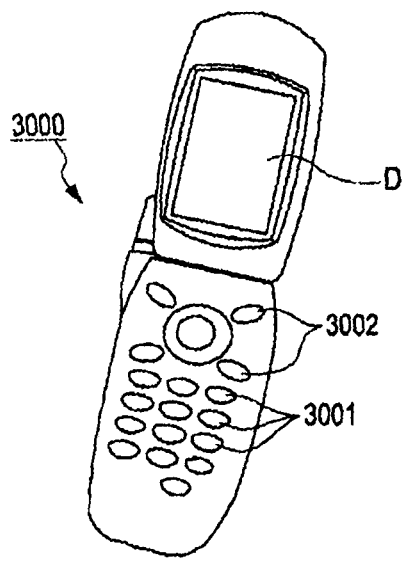
FIG. 34 is a perspective view of a cellular phone, which is an example of an electronic apparatus according to of the invention.

FIG. 34 shows the configuration of a cellular phone including one of the light-emitting devices D described above. A cellular phone 3000 has a plurality of operation buttons 3001, scroll buttons 3002, and the light-emitting device D as a display. By operating the scroll buttons 3002, it is possible to scroll a screen displayed on the light-emitting device D.

Figure 35:
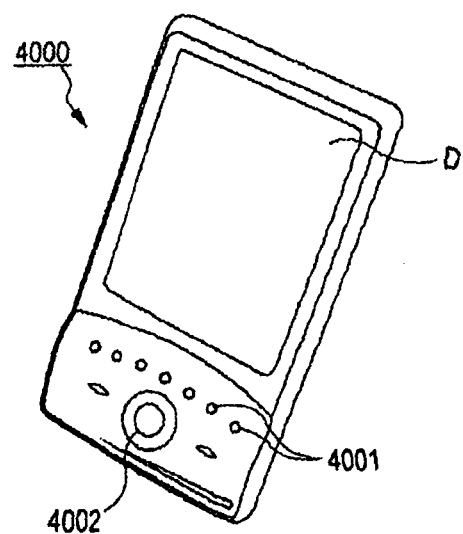
FIG. 35 is a perspective view of a portable information terminal, which is an example of an electronic apparatus according to the invention.

FIG. 35 shows a personal digital assistant (PDA) including one of the light-emitting devices D described above. A personal digital assistant 4000 has a plurality of operation buttons 4001, a power switch 4002, and the light-emitting device D as a display. When the personal digital assistant 4000 is powered on by operating the power switch 4002, various information can be displayed on the light-emitting device D, such as an address list or a schedule.

As well as the electronic apparatuses shown in FIGS. 33 to 35, examples of electronic apparatuses that can be implemented using light-emitting devices according to the invention include digital still cameras, TV sets, video cameras, car navigation devices, pagers, electronic notebooks, electronic papers, electronic calculators, word processors, workstations, video phones, point-of-sales (POS) terminals, printers, scanners, copying machines, video players, and devices having touch panels. Furthermore, applications of light-emitting devices according to the invention are not limited to image display. For example, in an image forming apparatus such as an optical-writing printer or electronic copying machine, a write head for exposing a photosensitive member correspondingly to an image to be formed on a recording medium such as a paper is used. Such a write head may be implemented using a light-emitting device according to the invention.

What is claimed is:

1. A light-emitting device comprising:
   a data line through which a data signal is transmitted;
   a power feeding line to which a predetermined potential is applied;
   a light-emitting element in which a light-emitting layer is interposed between a first electrode and a second electrode;
   a first transistor having a first gate electrode;
   a conducting portion that connects the first electrode of the light-emitting element to the first transistor,
   a second transistor that controls a conduction state between the first gate electrode of the first transistor and a first drain of the first transistor; and
   a connecting portion,
   the power feeding line having a first portion and a second portion, the first portion being disposed between the conducting portion and the data line in plan view, the first portion and the second portion extending linearly and a middle portion of the first portion and a middle portion of the second portion crossing each other in plan view,
   the first gate electrode of the first transistor being connected to the second transistor through the connecting portion, and
   the first portion of the power feeding line being disposed between the connecting potion and the data line.

2. The light-emitting device according to claim 1,
   the data line extending along a first direction,
   the second portion extending along a second direction different from the first direction, and
   the first portion of the power feeding line extending along the first direction.

3. The light-emitting device according to claim 2, further comprising:
   a selection line extending along the second direction; and
   a third transistor having a second gate electrode connected to the selection line.

4. An electronic apparatus comprising the light-emitting device according to claim 2.

5. The light-emitting device according to claim 1,
   the first portion of the power feeding line being disposed between the first gate electrode of the first transistor and the data line in plan view.

6. The light-emitting device according to claim 1, further comprising a first insulating layer disposed between the first electrode of the light-emitting element and the conducting portion, the first insulating layer having a first contact hole,
   the first electrode of the light-emitting element being connected to the conducting portion through a conducting material disposed in the first contact hole.

7. The light-emitting device according to claim 6,
   the first portion of the power feeding line and the conducting portion being formed out of the same layer.

8. The light-emitting device according to claim 1,
   the first transistor controlling a level of a current which flows through the light-emitting element according to the data signal, and
   the first transistor being electrically connected between the first electrode of the light-emitting element and the power feeding line when the current flows through the light-emitting element.

9. The light-emitting device according to claim 1, further comprising a fourth transistor connected between the first transistor and the power feeding line,
   the fourth transistor controlling a level of a current which flows through the light-emitting element according to the data signal, and
   the fourth transistor being electrically connected between the first electrode of the light-emitting element and the power feeding line when the current flows through the light-emitting element.

10. The light-emitting device according to claim 1:
    the first insulating layer contacting the first electrode.

11. An electronic apparatus comprising the light-emitting device according to claim 1.

* * * * *